(12) United States Patent
Dersch et al.

(10) Patent No.: US 9,786,657 B1
(45) Date of Patent: Oct. 10, 2017

(54) SEMICONDUCTOR STRUCTURE INCLUDING A TRANSISTOR INCLUDING A GATE ELECTRODE REGION PROVIDED IN A SUBSTRATE AND METHOD FOR THE FORMATION THEREOF

(71) Applicant: GLOBALFOUNDRIES Inc., Grand Cayman (KY)

(72) Inventors: Uwe Dersch, Moritzburg (DE); Ricardo Pablo. Mikalo, Heideblick (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/089,914

(22) Filed: Apr. 4, 2016

(51) Int. Cl.
| | |
|---|---|
| H01L 27/06 | (2006.01) |
| H01L 21/8238 | (2006.01) |
| H01L 21/84 | (2006.01) |
| H01L 27/092 | (2006.01) |
| H01L 27/12 | (2006.01) |
| H01L 29/06 | (2006.01) |
| H01L 29/78 | (2006.01) |
| H01L 29/08 | (2006.01) |

(52) U.S. Cl.
CPC .. *H01L 27/0629* (2013.01); *H01L 21/823807* (2013.01); *H01L 21/823814* (2013.01); *H01L 21/823878* (2013.01); *H01L 21/84* (2013.01); *H01L 27/092* (2013.01); *H01L 27/1203* (2013.01); *H01L 29/0646* (2013.01); *H01L 29/0847* (2013.01); *H01L 29/7838* (2013.01)

(58) Field of Classification Search
CPC .......... H01L 29/785; H01L 29/0847; H01L 29/4236
See application file for complete search history.

(56) References Cited

U.S. PATENT DOCUMENTS

| | | | |
|---|---|---|---|
| 6,432,791 B1 * | 8/2002 | Hutter | H01L 27/0629 257/E27.016 |
| 7,585,710 B2 * | 9/2009 | Park | H01L 21/28525 257/330 |
| 2002/0142552 A1 * | 10/2002 | Wu | H01L 21/823418 438/301 |
| 2005/0245046 A1 * | 11/2005 | Takafuji | H01L 27/1203 438/450 |

(Continued)

*Primary Examiner* — Marcos D Pizarro
*Assistant Examiner* — Shannon Yi
(74) *Attorney, Agent, or Firm* — Amerson Law Firm, PLLC

(57) ABSTRACT

A semiconductor structure includes a bulk semiconductor substrate, an electrically insulating layer over the substrate, an active layer of semiconductor material over the electrically insulating layer and a transistor. The transistor includes an active region, a gate electrode region and an isolation junction region. The active region is provided in the active layer of semiconductor material and includes a source region, a channel region and a drain region. The gate electrode region is provided in the bulk semiconductor substrate and has a first type of doping. The isolation junction region is formed in the bulk semiconductor substrate and has a second type of doping opposite the first type of doping. The isolation junction region separates the gate electrode region from a portion of the bulk semiconductor substrate other than the gate electrode region that has the first type of doping.

20 Claims, 18 Drawing Sheets

(56) References Cited

U.S. PATENT DOCUMENTS

| | | | |
|---|---|---|---|
| 2007/0007571 A1* | 1/2007 | Lindsay | H01L 21/26586 257/306 |
| 2007/0131965 A1* | 6/2007 | Kim | H01L 27/0262 257/173 |
| 2009/0256199 A1* | 10/2009 | Denison | H01L 29/0653 257/343 |
| 2010/0176453 A1* | 7/2010 | Dennard | H01L 21/76254 257/368 |
| 2014/0131735 A1* | 5/2014 | Hoentschel | H01L 21/84 257/77 |
| 2015/0001623 A1* | 1/2015 | Wang | H01L 29/78654 257/347 |
| 2015/0041799 A1* | 2/2015 | Morooka | H01L 29/7869 257/43 |

* cited by examiner

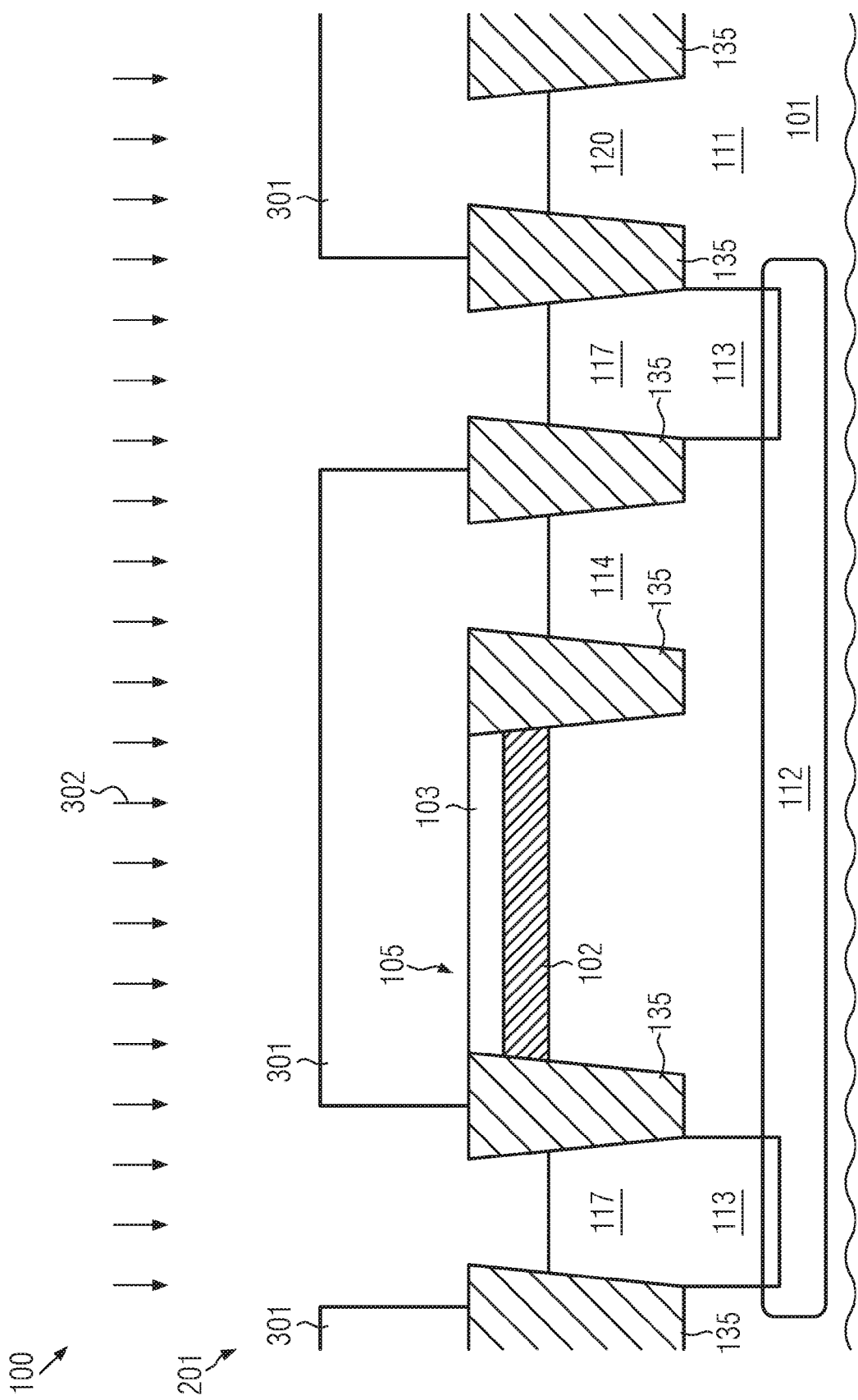

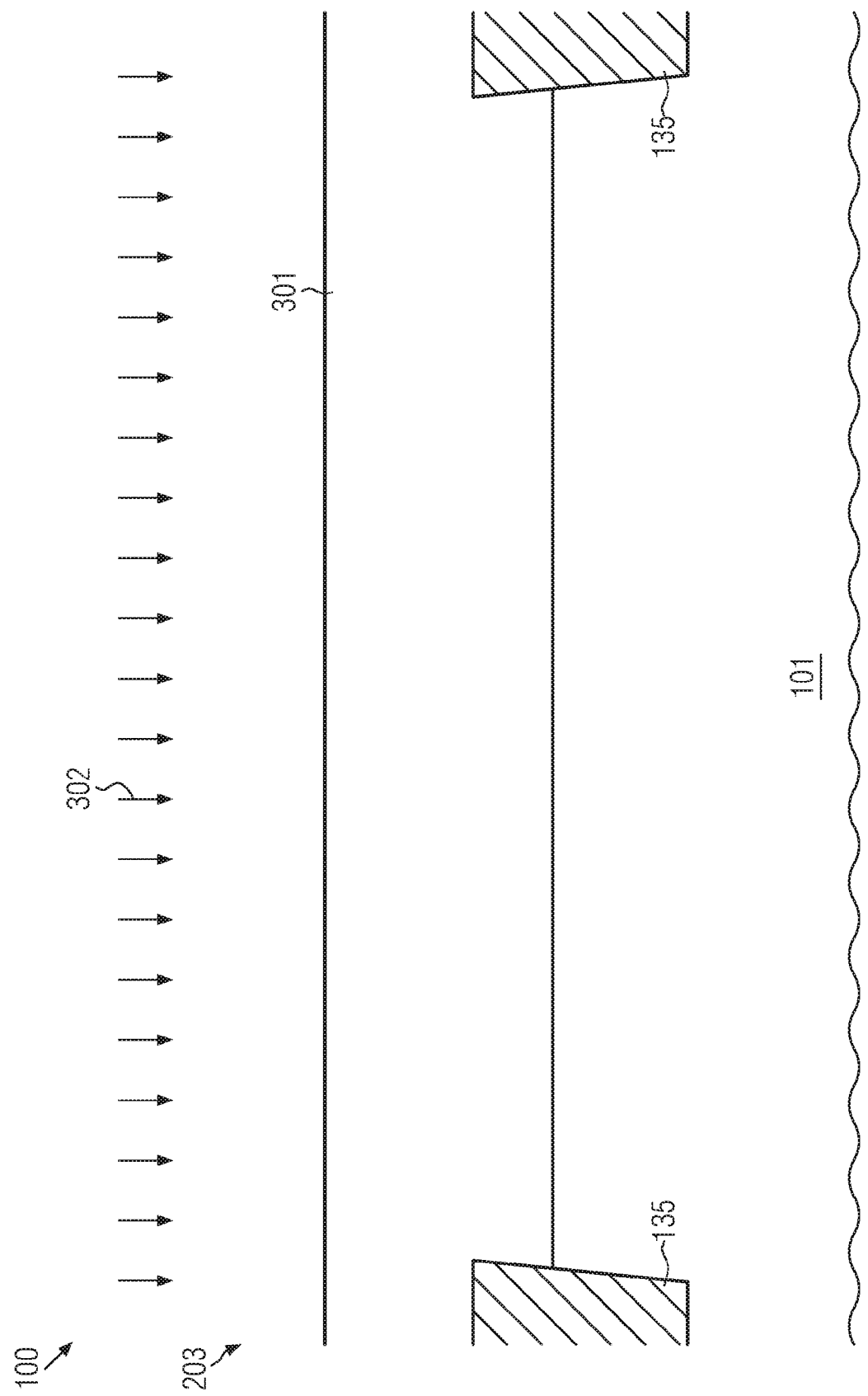

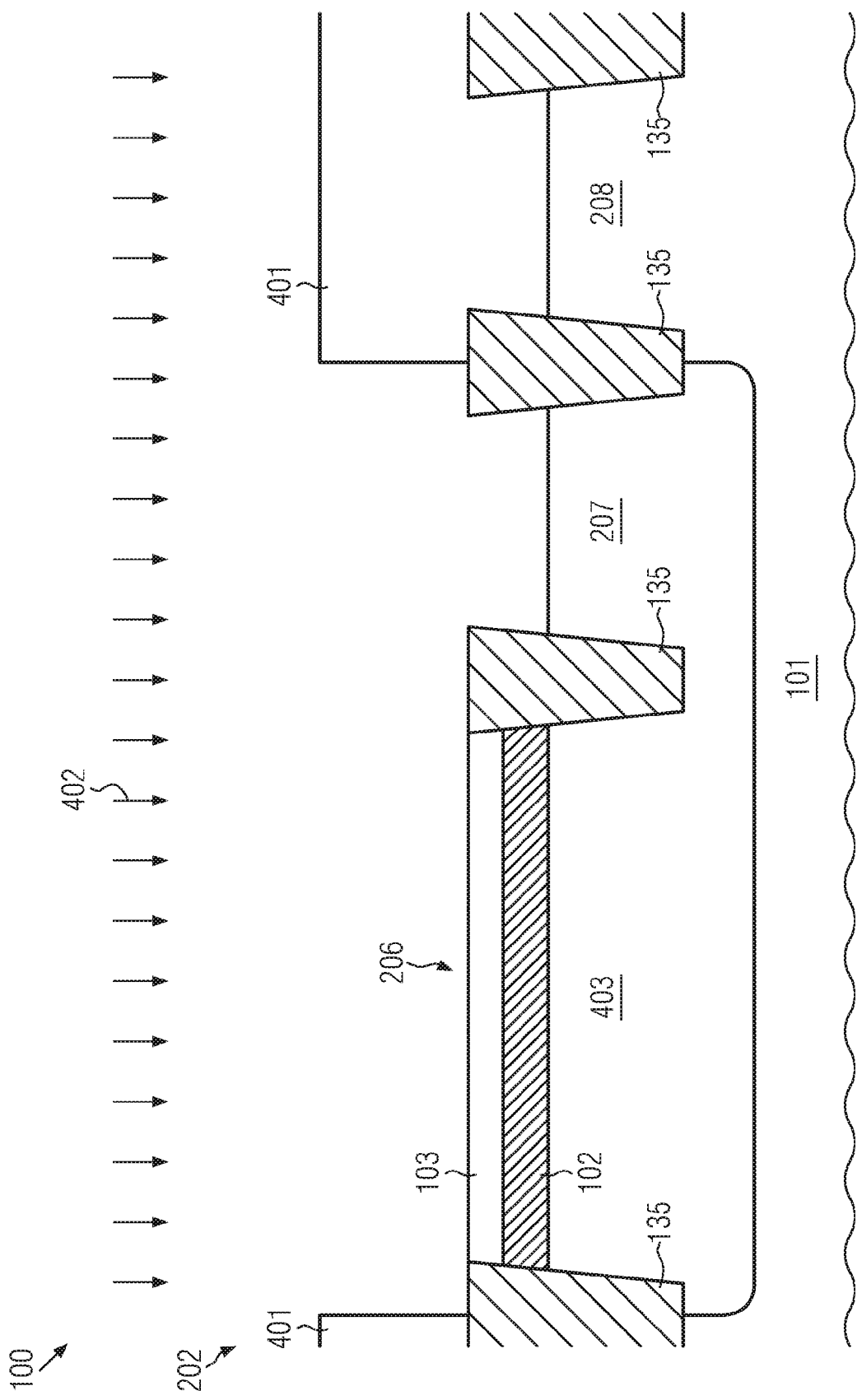

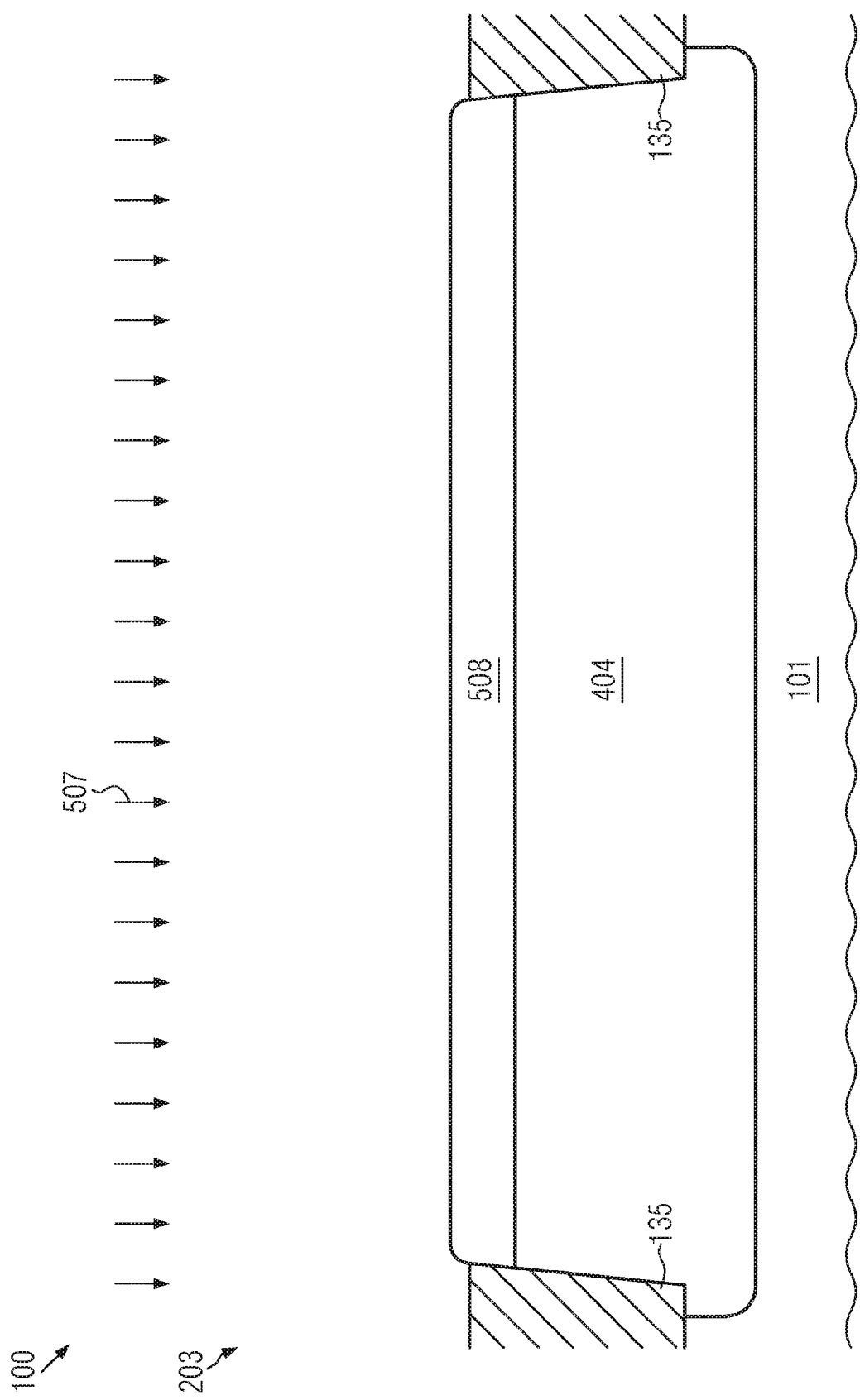

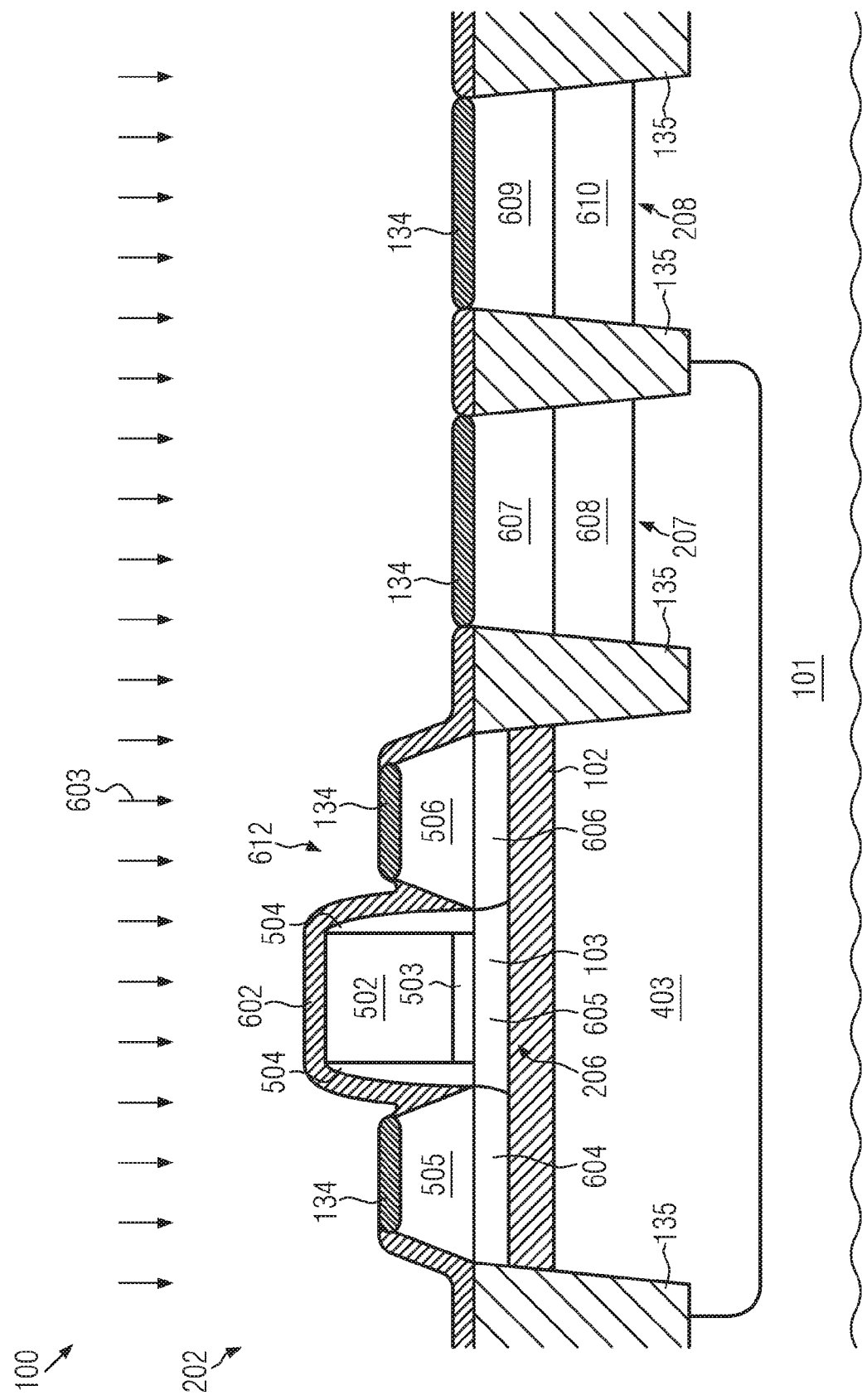

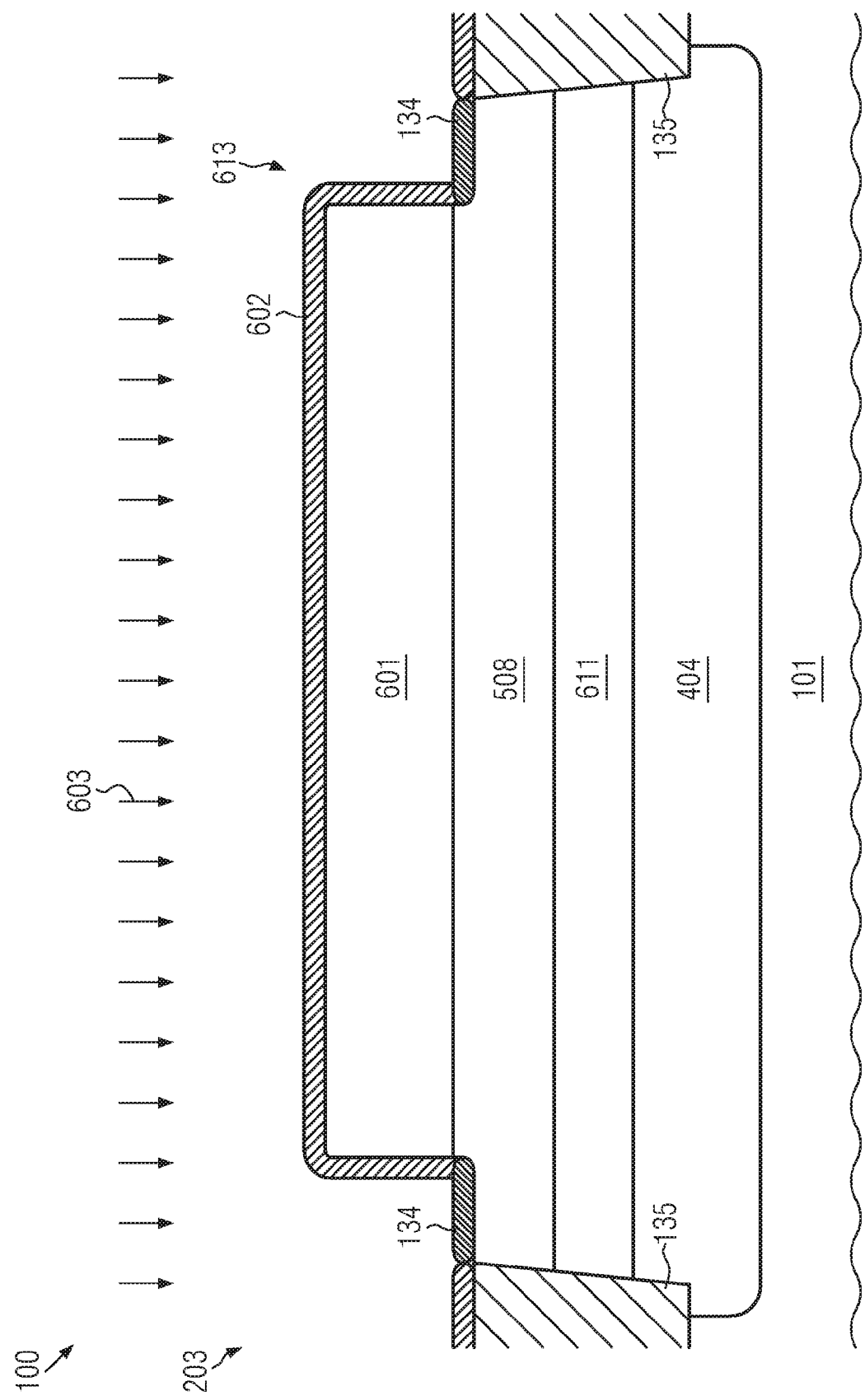

SEMICONDUCTOR STRUCTURE INCLUDING A TRANSISTOR INCLUDING A GATE ELECTRODE REGION PROVIDED IN A SUBSTRATE AND METHOD FOR THE FORMATION THEREOF

BACKGROUND OF THE INVENTION

1. Field of the Invention

Generally, the present disclosure relates to integrated circuits and methods for the formation thereof, and, more particularly, to integrated circuits including field effect transistors other than core device transistors and/or transistors that can be operated at a higher voltage than core device transistors.

2. Description of the Related Art

Integrated circuits include a large number of circuit elements which include, in particular, field effect transistors. In a field effect transistor, a gate electrode is provided that may be separated from a channel region by a gate insulation layer providing an electrical insulation between the gate electrode and the channel region. Adjacent the channel region, a source region and a drain region may be formed which are doped differently than the channel region.

Integrated circuits including field effect transistors may be formed in accordance with semiconductor-on-insulator (SOI) technology, wherein the source, channel and drain regions of the transistors are formed in a relatively thin semiconductor layer that is separated from a support substrate, which may be a semiconductor substrate, for example a silicon wafer or die, by an electrically insulating layer, which may be a silicon dioxide layer. SOI technology may have some advantages associated therewith which include a reduced power consumption of an SOI integrated circuit compared to a bulk semiconductor integrated circuit having the same performance. Moreover, in some examples of SOI technology, which are denoted as fully depleted semiconductor-on-insulator (FDSOI) technology, a thickness of the semiconductor layer wherein the source, channel and drain regions of the transistors are formed may be adapted such that a full depletion of the channel region of the transistors may be obtained in the operation of the transistors. Thus, the electrostatic control of the channel regions of the transistors may be improved, effects of random dopant fluctuations may be reduced, and leakage currents of the transistors may be reduced.

SOI technology may allow for doped back gate regions in the support substrate below the electrically insulating layer that separates the support substrate from the semiconductor material of the source, channel and drain regions of the transistors. The type of doping and the dopant concentration in a back gate region provided below a transistor may have an influence on the threshold voltage of the transistor that needs to be applied to the gate electrode of the transistor for switching the transistor between an OFF-state, wherein the transistor has only a small electrical conductivity, and an ON-state, wherein the transistor has a relatively high electrical conductivity. Additionally, the threshold voltage of the transistor may be influenced by applying a bias voltage to the back gate region.

The threshold voltage of a field effect transistor may be related to a leakage current that flows through the transistor in the OFF-state. Typically, a lower threshold voltage is associated with an increased leakage current and vice versa. Lowering the threshold voltage of the field effect transistors in an integrated circuit may help to increase the speed of operation of logic gates wherein the transistors are provided, whereas a reduction of the leakage current may help to reduce power consumption.

In advanced technology nodes such as, for example, the 22 nm technology node and below, fully depleted semiconductor-on-insulator technology may be used in combination with doped back gate regions. Thus, different variants of core device transistors including super-low threshold voltage (SLVT) core device transistors, low threshold voltage (LVT) core device transistors, regular threshold voltage (RVT) core device transistors and high threshold voltage (HVT) core device transistors may be provided. Each of these variants of core device transistors may be provided both for P-channel transistors and N-channel transistors. Furthermore, different variants of input/output transistors, which may include super-low threshold voltage input/output transistors and low threshold voltage input/output transistors, may be provided.

For some applications, it may be desirable to provide types of field effect transistors other than core device transistors and input/output transistors in integrated circuits wherein fully depleted semiconductor-on-insulator technology is employed. Such other types of field effect transistors may include transistors that are adapted for operation at a relatively high voltage of about 10 V or more between their gate electrodes and their source/drain electrodes. Further types of field effect transistors that may be desirable for some applications include depletion transistors, which are in their ON-state when mass potential is applied at their gate electrodes, as opposed to enhancement transistors, which are in their OFF-state when mass potential is applied at their gate electrodes. Depletion transistors may be used in automotive applications and in length regulators at charge pumps. Charge pumps may be provided in fully depleted semiconductor-on-insulator integrated circuits to generate the back gate voltages for the logic circuit parts.

In view of the above considerations, the present disclosure provides techniques that may allow the formation of depletion transistors and transistors that may be operated at relatively high voltages in an integrated circuit wherein fully depleted semiconductor-on-insulator technology is employed. In particular, in some embodiments, the present disclosure can provide techniques for the formation of such transistors wherein processes and mask layers that are also used for the formation of other devices in a fully depleted semiconductor-on-insulator integrated circuit may be employed for the formation of depletion transistors and/or higher voltage transistors.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a semiconductor substrate, an electrically insulating layer over the substrate, a layer of semiconductor material over the electrically insulating layer and a transistor. The transistor includes an active region and a gate electrode region. The active region is provided in the layer of semiconductor material and includes a source region, a channel region and a drain region. The gate electrode region is provided in the substrate and has a first type of doping. At least a portion of the gate electrode region is arranged directly below a portion of the electrically insulating layer below the channel region. The transistor does not include a gate electrode other than the gate electrode region. Another illustrative semiconductor structure disclosed herein includes a semiconductor substrate, an electrically insulating layer over the substrate, a layer of semiconductor material over the electrically insulating layer and a transistor. The transistor includes an active region, a gate electrode region, an isolation junction region and an interlayer dielectric. The active region is provided in the layer of semiconductor material and includes a source region, a channel region and a drain region. The gate electrode region is provided in the substrate and has a first type of doping. At least a portion of the gate electrode region is arranged directly below a portion of the electrically insulating layer below the channel region. The isolation junction region is formed in the substrate and has a second type of doping opposite the first type of doping. The isolation junction region separates the gate electrode region from a portion of the substrate other than the gate electrode region that has the first type of doping. The interlayer dielectric is provided over the channel region on a side of the layer of semiconductor material opposite the substrate.

An illustrative method disclosed herein includes providing a semiconductor structure. The semiconductor structure includes a substrate, an electrically insulating layer over the substrate and a layer of semiconductor material over the electrically insulating layer. A first transistor is formed. The formation of the first transistor includes forming a gate electrode region in the substrate. The gate electrode region has a first type of doping. At least a portion of the gate electrode region is arranged directly below the electrically insulating layer. The formation of the first transistor further includes forming an active region of the first transistor in the layer of semiconductor material. The active region of the first transistor includes a source region, a channel region and a drain region of the first transistor. At least the channel region of the first transistor is provided above the at least a portion of the gate electrode region that is arranged directly below the electrically insulating layer. No gate electrode of the first transistor is formed on a side of the layer of semiconductor material opposite the substrate.

BRIEF DESCRIPTION OF THE DRAWINGS

The disclosure may be understood by reference to the following description taken in conjunction with the accompanying drawings, in which like reference numerals identify like elements, and in which:

FIG. 1b shows a schematic top view of the portion of the semiconductor structure shown in FIG. 1a;

Figure 1A:
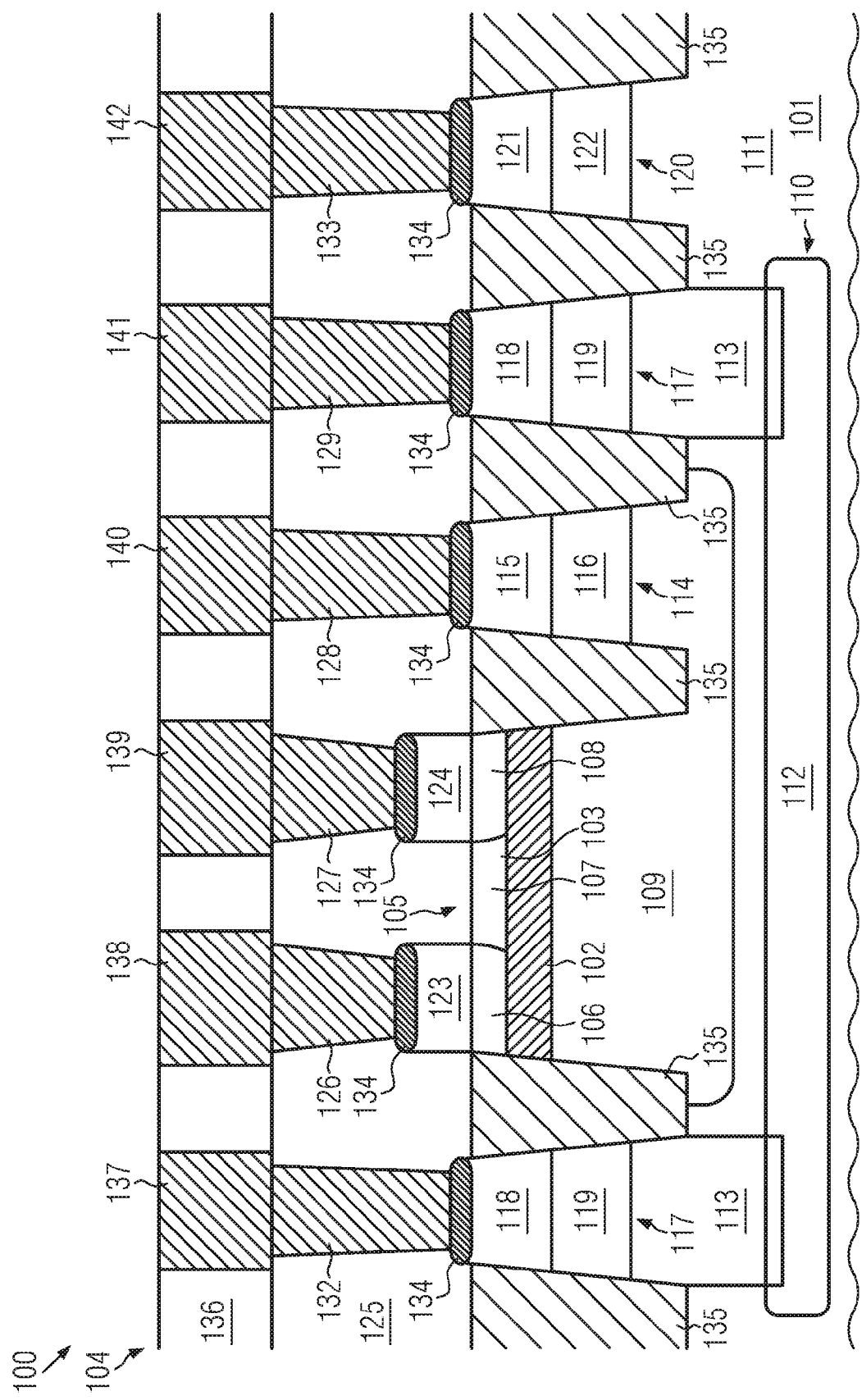
FIG. 1a shows a schematic cross-sectional view of a portion of a semiconductor structure according to an embodiment wherein a transistor is provided.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, a variety of core device transistors, in particular logic transistors, may be provided in an integrated circuit that is formed in accordance with fully depleted semiconductor-on-insulator (FDSOI) technology, for example, FDSOI technology according to the 22 nm technology node. The core device transistors may include super-low threshold voltage (SLVT), low threshold voltage (LVT), regular threshold voltage (RVT) and high threshold voltage (HVT) N-channel and P-channel transistors. These transistors may include a main gate and a back gate, which may be used for threshold voltage control of the channels of the transistors. The back gate may be used to operate groups of transistors in a zero-, forward- or backward-biased mode, depending on whether a high speed of operation or a low leakage current is desirable for the transistor. Furthermore, a bulk contact may be provided to allow connection to a material of the support substrate of the semiconductor-on-insulator structure, which may be P-doped.

The present disclosure provides an additional transistor type which, in some embodiments, may be provided in an integrated circuit in addition to the core device transistors described above, and which may be formed using process steps that are employed for the formation of core device transistors and diffusion resistors provided in the integrated circuit. Different from core device transistors, the additional transistor type need not include a main gate that is formed on a side of the layer of semiconductor material of the semiconductor-on-insulator structure opposite the electrically insulating layer and the support substrate. Instead, the electrical conductivity of the channel of the additional transistor type may be controlled by means of a gate electrode region that is provided in the support substrate of the semiconductor-on-insulator structure, and which may be formed in process steps that are employed for the formation of back gate regions of core device transistors having a main gate.

In some embodiments, the additional transistor type may provide depletion transistors that are in an electrically conductive ON-state when mass potential is applied to their gate electrode regions. Additionally and/or alternatively, the additional transistor type may be employed for providing transistors that may be operated at higher voltages than core device transistors and/or input/output transistors, for example, at voltage differences between their gate electrode regions and their source and/or drain regions of about 10 V or more. Transistors of the additional transistor type may include N-channel transistors as well as P-channel transistors.

In the following, description will mainly be made of embodiments including depletion N-channel transistors wherein, however, it is to be understood that the present disclosure is not limited to depletion transistors and to N-channel transistors. In other embodiments, depletion P-channel transistors and/or higher voltage enhancement transistors may be formed.

Depletion N-channel transistors as disclosed herein may include a gate electrode region that may be provided in the form of a P-doped well region in a P-doped support substrate of a semiconductor-on-insulator structure that is physically isolated from the surrounding P-doped support substrate by means of an isolation junction region. The isolation junction region may be an N-doped well region which may have a tub shape.

The isolation junction region may enclose a portion of the gate electrode region at the channel of the depletion N-channel transistor that provides a gate of the depletion N-channel transistor and a portion of the gate electrode region where a gate electrode contact region providing an electrical connection to the gate electrode region is formed. A bottom of the isolation junction region may be formed by means of a deep N-well implant, and it may be connected to an N-doped sidewall well region enclosing the gate electrode region like a fence. The sidewall well region may be formed by means of a different ion implantation than the deep N-well. The isolation junction region may provide an electrical insulation of the depletion N-channel transistor from its surroundings.

In fully depleted semiconductor-on-insulator processing for core devices, gate stacks and sidewall spacers may be formed on top of a thin layer of semiconductor material, for example, a silicon layer. The silicon layer may be part of an incoming wafer material, and it may be thinned to its desired thickness. In the formation of an N-channel field effect transistor, N-doped silicon may be grown on contact areas by means of an epitaxial growth process. In doing so, raised source and drain regions are formed. In core device transistors, the area of the raised source/drain regions may correspond to an area of an active region of the transistor that is not covered by an epitaxy block mask, with the exception of the area covered by the gate stack and the sidewall spacers. Thus, during the epitaxial growth process of the core device transistors, and during a subsequent silicide process, for example a nickel silicide process, wherein silicide is formed at the raised source and drain regions, the silicon in the channel of the transistors is protected by the gate stack and its spacers.

In the case of a depletion N-channel transistor, the same silicon layer as used in the implementation of an N-channel core device transistor may be used to form the channel. In contrast to core device transistors, the area between the contacts may have to be protected from an epitaxial growth wherein N-doped silicon is deposited and a silicidation process. Otherwise, the channel of the depletion N-channel transistor, which is not covered by a gate stack flanked by sidewall spacers, might be covered by a highly conductive silicide layer, which might prevent any transistor behavior to build up. The protection of the channel region of the depletion N-channel transistor during the epitaxial growth of N-doped silicon may be provided by an epitaxy block mask, which may be formed by patterning a nitride layer. The epitaxy block mask may also be employed for protecting P-channel core device transistors during the epitaxial growth of N-doped silicon.

For avoiding a silicidation of the channel region of the depletion N-channel transistor, a silicide block mask, which may also be used in the formation of N-doped diffusion resistors, may be employed. An area covered by the silicide block mask defines an area of the semiconductor structure that is protected from the silicidation process.

A threshold voltage of the depletion N-channel transistor may depend on a doping of its channel region, which may include mainly intrinsic silicon having a side doping received from the raised source and drain regions. Due to the relatively low thickness of the silicon layer, doping implants may be less effective for threshold voltage control. A greater influence on the threshold voltage may be created by the doping of the gate electrode region. The doping of the gate electrode region may be modified using pre-gate implants that may also be employed for a conversion of super-low threshold voltage core device transistors to low threshold voltage core device transistors.

In the depletion N-channel transistor, only the gate electrode region needs to be used for controlling an electrical conductivity of the channel. Different from core device transistors, no additional gate needs to be provided on top of the channel. Depending on the voltage applied to the gate electrode region, a depletion of charge carriers may be obtained in the channel of the depletion N-channel transistor. If mass potential (0 V) is applied to the gate electrode region, the depletion N-channel transistor may be in its electrically conductive ON-state, wherein it has a relatively low resistance defined by the negative charge carrier density in the channel. The resistance of the channel may be lowered further by increasing the voltage applied to the gate electrode region above 0 V. If a negative voltage is applied to the gate electrode region, the negative majority charge carriers may be removed from the channel. In consequence, the channel may be depleted, and the channel resistivity may be increased.

For obtaining a depletion of the channel of the depletion N-channel transistor, a gate voltage may be required that is significantly lower than the lowest electrical potential used in the surrounding circuitry including core device transistors. Therefore, an electrical isolation of the depletion N-channel transistor from its surrounding may be provided by the isolation junction region. For preventing high leakage currents flowing through the PN-transition between the isolation junction region and the gate electrode region, and through the PN-transition between the isolation junction region and a portion of the substrate outside the isolation junction region, the potential applied at the isolation junction region may be always kept significantly higher than the potentials at the gate electrode region and the bulk of the substrate, for example, by about 0.7 V or more. In some embodiments, a voltage applied at the isolation junction region may be about +4 V. In such embodiments, the voltage applied at the gate electrode region of the depletion N-channel transistor may be varied within the range from about −3 V to about +3 V. A source and drain operation voltage range may be determined by a thickness of the electrically insulating layer of the semiconductor-on-insulator structure. In some embodiments, the electrically insulating layer may have a thickness of about 20 nm, which may allow maximum voltages between the gate and the source and drain regions of about 10 V or more. However, in some implementations, a relatively small voltage of about 0.8 V may be applied between the source region and the drain region.

In other embodiments, P-channel transistors may be provided, which may be depletion transistors that are in an electrically conductive on-state when mass potential is applied to their gate electrode regions, or transistors that may be operated at a higher voltage than core device transistors and/or input/output transistors. In some embodiments, P-channel transistors may be provided without a tub-shaped isolation junction region as described above. In such embodiments, an N-doped gate electrode region may be provided, wherein there is a PN-transition between the gate electrode region and a P-doped bulk region having a doping in accordance with the base doping of the substrate. The PN-transition may provide an insulation of the gate electrode region when a positive voltage is applied to the gate electrode region.

Figure 1B:
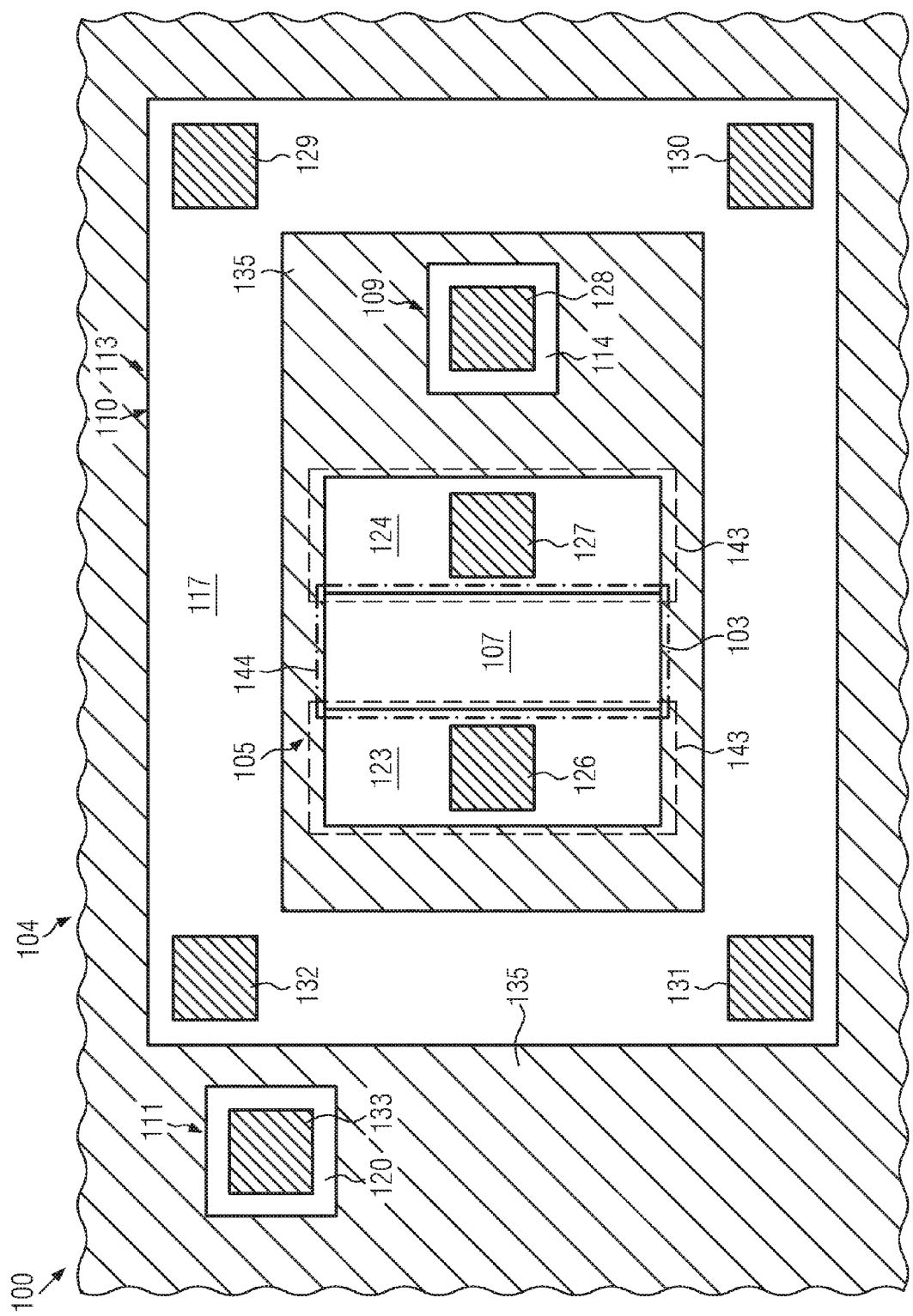

FIG. 1a shows a schematic cross-sectional view of a semiconductor structure 100 according to one illustrative embodiment disclosed herein. A schematic top view of the semiconductor structure 100 is shown in FIG. 1b. For clarity of illustration, in FIGS. 1a and 1b, a certain degree of simplification was used. For example, in FIG. 1a, cross-sections of an isolation junction contact region 117, isolation junction contacts 128, 132, a bulk contact region 120 and a bulk contact 133 are shown which, as can be seen in the schematic top view of FIG. 1b, may be provided in different planes than other elements shown in FIG. 1a, as illustrated in FIG. 1b. Furthermore, in FIG. 1b, silicide regions 134, interlayer dielectrics 125, 136 and electrically conductive lines 137 to 142 have been omitted in order to not obscure elements of the semiconductor structure 100 there below.

The semiconductor structure 100 may include a bulk semiconductor substrate 101, which may be a wafer or die formed of a semiconductor material such as, for example, silicon. Over the bulk semiconductor substrate 101, an electrically insulating layer 102 which may be formed of an electrically insulating material such as, for example, silicon dioxide, and an active layer 103 of semiconductor material, for example a silicon layer, may be provided. The bulk semiconductor substrate 101, the electrically insulating layer 102 and the active layer 103 of semiconductor material may provide a semiconductor-on-insulator (SOI) structure, wherein active regions of transistors may be formed in the active layer 103 of semiconductor material, the bulk semiconductor substrate 101 provides a support substrate of the SOI structure, and the electrically insulating layer 102 may provide an electrical isolation between the active layer 103 of semiconductor material and portions of the bulk semiconductor substrate 101 there below.

In some embodiments, the electrically insulating layer 102 may have a thickness in a range from about 10-30 nm, for example, a thickness of about 20 nm, and the active layer 103 of semiconductor material may have a thickness in a range from about 5-10 nm so that a full depletion of channel regions of transistors formed in the active layer 103 of semiconductor material may be obtained in the operation of the transistors. Thus, the substrate 101, the electrically insulating layer 102 and the active layer 103 of semiconductor material may provide a fully depleted semiconductor-on-insulator (FDSOI) structure.

The semiconductor structure 100 may include a transistor 104. In some embodiments, the transistor 104 may be a depletion N-channel transistor. As will be detailed below with respect to FIGS. 2a-6c, in other portions of the semiconductor structure 100, further circuit elements may be provided, which may include a core device transistor, which will be described in more detail below with reference to FIGS. 2b, 3b, 4b, 5b and 6b, and a diffusion resistor, which will be described in more detail below with reference to FIGS. 2c, 3c, 4c, 5c and 6c.

The transistor 104 may include an active region 105 provided in the active layer 103 of semiconductor material. The active region 105 may include a source region 106, a drain region 108 and a channel region 107 between the source region 106 and the drain region 108. In some embodiments, the transistor 104 may be an N-channel transistor, and the source region 106 and the drain region 108 may be N-doped. The channel region 107 may be substantially undoped, or it may have a small N-type doping, which may be caused by diffusion of N-type dopants from the source region 106 and the drain region 108 into the channel region 107. However, a concentration of dopants in the channel region 107 is typically substantially lower than a concentration of dopants in the source region 106 and the drain region 108. Over the source region 106, a raised source region 123 may be provided, and a raised drain region 124 may be provided over the drain region 108. The raised source region 123 and the drain region 124 may be doped, a type of doping of the raised source region 123 and the raised drain region 124 corresponding to the type of doping of the source region 106 and the drain region 108. In particular, in embodiments wherein the transistor 104 is an N-channel transistor, the raised source region 123 and the raised drain region 124 may be N-doped.

The transistor 104 may further include a gate electrode region 109. The gate electrode region 109 may be provided in the semiconductor material of the substrate 101. A portion of the gate electrode region 109 may provide a gate electrode of the transistor 104 and may be arranged below the portion of the active layer 103 of semiconductor material wherein the active region 105 of the transistor 104, in particular the channel region 107, is provided. The portion of the gate electrode region 109 providing the gate electrode of the transistor 104 may be separated from the active region 105 by a portion of the electrically insulating layer 102, which may provide a gate insulation layer of the transistor 104. At another portion of the gate electrode region 109, a gate contact region 114 may be provided. The gate contact region 114 may be separated from the active region 105 by a trench isolation structure 135. A depth of the gate electrode region 109 may be greater than a depth of the trench isolation structure 135 so that there is a portion of the gate electrode region 109 below the trench isolation structure 135 which may provide an electrical connection between the gate electrode contact region 114 and the portion of the gate electrode region 109 below the active region 105. The gate electrode region 109 and the gate electrode contact region 114 may have a first type of doping. In some embodiments, the gate electrode region 109 and the gate electrode contact region 114 may be P-doped. A dopant concentration in the gate electrode contact region 114 may be greater than a dopant concentration in other parts of the gate electrode region 109, in particular greater than a dopant concentration of the portion of the gate electrode region 109 below the channel region 107.

The transistor 104 need not include a gate electrode other than the portion of the gate electrode region 109 below the channel region 107. Thus, an interlayer dielectric 125 may be provided over the channel region 107 on a side of the channel region 107 opposite the gate electrode region 109. Optionally, one or more layers of electrically insulating material, for example, a liner layer formed of a different material than the interlayer dielectric 125, may also be provided over the channel region 107, wherein, however, no electrically conductive material to which an electric voltage may be applied in the operation of the transistor 104 is arranged over the channel region 107 at a distance to the channel region 107 that is small enough for allowing the voltage applied to the electrically conductive material to have a substantial influence on a charge carrier density in the channel region 107.

The transistor 104 may further include an isolation junction region 110. The isolation junction region 110 may include a deep well region 112 and a sidewall well region 113. The deep well region 112 and the sidewall well region 113 may have a second type of doping that is opposite to the first type of doping of the gate electrode region 109. In some embodiments, the deep well region 112 and the sidewall well region 113 may be N-doped. As shown in FIG. 1A, there may be a certain degree of overlap between the sidewall well region 113 and the deep well region 112 so that the sidewall well region 113 and the deep well region 112 are continuous with each other. Herein, regions in a semiconductor material such as, for example, the semiconductor material of the substrate 101, will be denoted as "continuous with each other" if both regions of the semiconductor material have the same type of doping, and there is an electrically conductive path without a PN-transition therebetween.

The isolation junction region 110 may have a tub shape, wherein a bottom of the tub is provided by the deep well region 112 and a sidewall of the tub is provided by the sidewall well region 113. The deep well region 112 may be arranged below the gate electrode region 109 and the sidewall well region 113 may annularly enclose the gate electrode region 109 so that the gate electrode region 109 is separated from a bulk region 111 in the substrate 101 by the isolation junction region 110. The bulk region 111 may have the first type of doping. The type of doping of the bulk region 111 may be the same type of doping as the type of doping of the gate electrode region 109. For example, the bulk region 111 may be P-doped, in accordance with a base doping of the substrate 101. Thus, there may be a PN-transition between the gate electrode region 109 and the isolation junction region 110, and there may also be a PN-transition between the isolation junction region 110 and the bulk region 111. As will be explained in more detail below, in the operation of the transistor 104, the PN-transition between the isolation junction region 110 and the gate electrode region 109, as well as the PN-transition between the isolation junction region 110 and the bulk region 111, may be biased in the reverse direction so that a flow of an electric current between the gate electrode region 109 and the bulk region 111 may be substantially prevented.

The isolation junction region 110 may include an isolation junction contact region 117, which may be provided at an upper part of the sidewall well region 113. The isolation junction contact region 117 may have the second type of doping, and it may have a higher dopant concentration than the deep well region 112 and/or portions of the sidewall well region 113 below the isolation junction contact region 117. A portion of the trench isolation structure 135 may be arranged between the isolation junction contact region 117 and the active region 105 as well as between the isolation junction contact region 117 and the gate electrode region 109.

The transistor 104 may further include a bulk contact region 120 having the first type of doping and being continuous with the bulk region 111, wherein a dopant concentration of the bulk contact region 120 is greater than a dopant concentration of the bulk region 111.

The gate electrode contact region 114 may include an upper portion 115 and a lower portion 116. As will be detailed below, the upper portion 115 may be formed by means of epitaxial deposition of a semiconductor material having the first type of doping, and the lower portion 116 may be formed by diffusing dopants from the upper portion 115 into the semiconductor material of the substrate 101 below the upper portion 115. Similarly, the isolation junction contact region 117 may include an upper portion 118 which may be formed by epitaxially depositing semiconductor material having the second type of doping and a lower portion 119 may can be formed by diffusing dopants from the upper portion 118 into the semiconductor material of the substrate 101 below the upper portion 118. The bulk contact region 120 may include an upper portion 121 that may be formed by epitaxially depositing semiconductor material having the first type of doping, and a lower portion 122 that may be formed by diffusing dopants from the upper portion 121 into the semiconductor material of the substrate 101 below the upper portion 121.

The trench isolation structure 135 may include portions separating the isolation junction contact region 117 from the bulk contact region 120, and portions separating the transistor 104 from other circuit elements of the semiconductor structure 100.

In some embodiments, a silicide 134 may be provided in each of the raised source region 123, the raised drain region 124, the gate electrode contact region 114, the isolation junction contact region 117 and the bulk contact region 120. In the interlayer dielectric 125, a source contact 126 providing an electrical connection to the raised source region 123, a drain contact 127 providing an electrical connection to the raised drain region 124 and a gate contact 128 providing an electrical connection to the gate contact region 114 may be provided. Additionally, a plurality of isolation junction contacts 129 to 132 providing electrical connection to the isolation junction contact region 117 and a bulk contact 133 providing an electrical connection to the bulk contact region 120 may be provided.

In some embodiments, the sidewall well region 113 and the isolation junction contact region 117 may have an approximately rectangular shape, as illustrated in the top view of FIG. 1*b*, wherein one of the isolation junction contacts 129 to 132 may be provided at each of the corners of the substantially rectangular shape. However, the present disclosure is not limited to embodiments wherein four isolation junction contacts 129 to 132 are provided. In other embodiments, a greater or smaller number of isolation junction contacts 129 to 132 equal to or greater than one may be provided.

The source contact 126, the drain contact 127, the gate contact 128, the isolation junction contacts 129 to 132 and the bulk contact 133 may be provided in the form of contact holes formed in the interlayer dielectric 125 that are filled with an electrically conductive material, such as, for example, tungsten, and they may be electrically connected to electrically conductive lines 137 to 142 that are formed in an interlayer dielectric 136 above the interlayer dielectric 125. In some embodiments, the electrically conductive lines 137 to 142 may be provided in the form of trenches filled with an electrically conductive material such as, for example, copper or a copper alloy.

In FIG. 1b, reference numeral 143 denotes openings of an epitaxy block mask that may be employed in the formation of the raised source region 123, and the raised drain region 124. Reference numeral 144 denotes a location of a silicide block mask that may be used in a silicidation process, wherein the silicide 134 is formed, for preventing a formation of silicide in the channel region 107 of the transistor 104. The epitaxy block mask and the silicide block mask will be described in more detail below.

A conductivity of the channel 107 of the transistor 104 may be controlled by applying a voltage to the gate contact region 114 via the gate connection 128. In addition to the voltage applied to the gate contact region 114, the conductivity of the channel 107 may depend on the doping of the channel region 107, as well as on the doping of the portion of the gate electrode region 109 below the channel region 107.

In embodiments wherein the transistor 104 is a depletion transistor, the doping of the channel region 107 and/or the portion of the gate electrode region 109 below the channel region 107 may be adapted such that the transistor 104 is in an electrically conductive on-state when mass potential (0 V) is applied to the gate contact 128. In embodiments wherein the transistor 104 is an N-channel depletion transistor, a positive voltage of, for example, about +0.8 V may be applied to the drain region 108 via the drain contact 127, and 0 V may be applied to the source region 106 via the source contact 126. The bulk region 111 may be maintained at mass potential by applying 0 V to the bulk contact 133, and a positive voltage of, for example, about +4 V may be applied to the isolation junction region 110 via the isolation junction contacts 129 to 132. By applying a positive voltage of, for example, about +3 V to the gate contact 128, the conductivity of the channel region 107 may be further increased beyond the conductivity obtained by applying 0 V to the gate contact 128. By applying a negative voltage of, for example, −3 V to the gate contact 128, the channel region 107 may be switched into an off-state, wherein only a small leakage current can flow through the channel region 107. The electric potential applied to the isolation junction contacts 129 to 132 may be adapted such that the PN-transition between the isolation junction region 110 and the gate electrode region 109 and the PN-transition between the isolation junction region 110 and the bulk region 111 are always biased in the reverse direction during the operation of the transistor 104. Thus, a flow of an electric current between the gate electrode region 109 and the bulk region 111 may be substantially prevented, even if different voltages are applied to the gate electrode contact 128 and the bulk contact 133. In some embodiments, the electric potential applied to the isolation junction contacts 129 to 132 may be adapted such that it is always at least 0.7 V greater than the electric potentials applied to the gate electrode contact 128 and the bulk contact 133.

The above mentioned values of the electric potentials applied to the contacts 126 to 133 are of an exemplary nature only. In other embodiments, different values of the electric potentials may be used.

The present disclosure is not limited to embodiments wherein the transistor 104 is an N-channel depletion transistor. In other embodiments, the transistor 104 may be a P-channel depletion transistor, wherein the source region 106, the drain region 108, the raised source region 123 and the raised drain region 124 and, optionally, also the channel region 107, are P-doped. Additionally, in embodiments wherein the transistor 104 is a P-channel transistor, some modifications of the configuration of the transistor 104 may be made, as will be detailed below.

Furthermore, the present disclosure is not limited to embodiments wherein the transistor 104 is a depletion transistor. In other embodiments, the doping of the channel region 107 and/or the gate electrode region 109 may be adapted such that the transistor 104 is in an off-state wherein only a relatively small leakage current can flow through the channel region 107 when mass potential is applied to the gate contact 128. In such embodiments, the transistor 104 may be switched to the on-state by calculating a positive voltage to the gate contact 128 (in embodiments wherein the transistor 104 is an N-channel transistor), or by applying a negative voltage to the gate contact 128 (in embodiments wherein the transistor 104 is a P-channel transistor). In such embodiments, the transistor 104 may be used as a higher voltage transistor, wherein a relatively high voltage difference of about 10 V or more may be applied between at least one of the source 126 and drain 127 contacts and the gate electrode region 109. The relatively high thickness of the electrically insulating layer 102 of the semiconductor-on-insulator structure provided by the active layer 103 of semiconductor material, the electrically insulating layer 102 and the substrate 101 may provide a sufficient dielectric strength to withstand relatively high voltage differences between the active region 105 and the gate electrode region 109.

In the following, methods that may be employed for forming the semiconductor structure 100 will be described with reference to FIGS. 2a-6c.

Figure 2A:
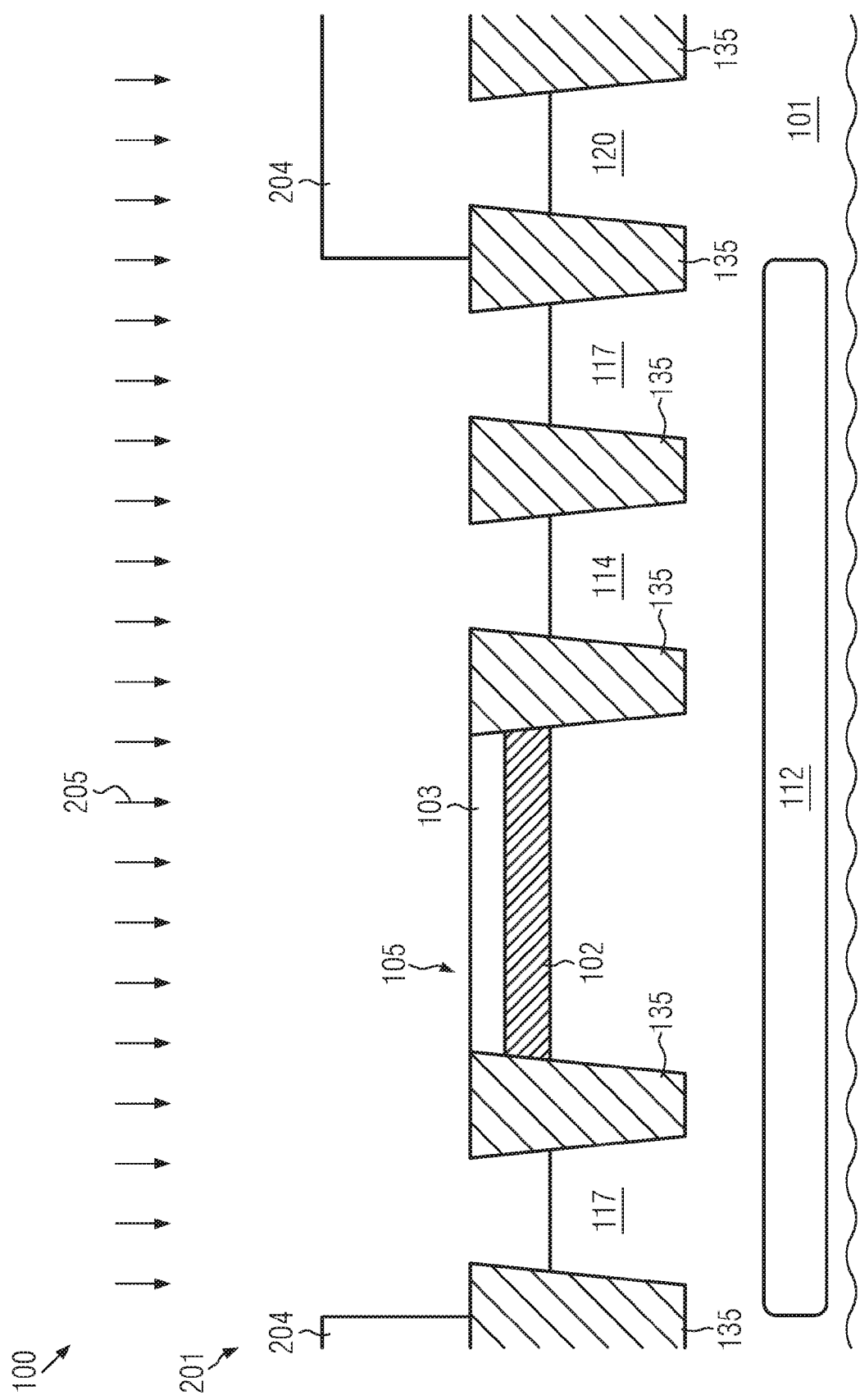
FIGS. 2a-6c show schematic cross-sectional views of portions of the semiconductor structure shown in FIGS. 1a-1b in stages of a method of manufacturing a semiconductor structure according to an embodiment.
Figure 2B:
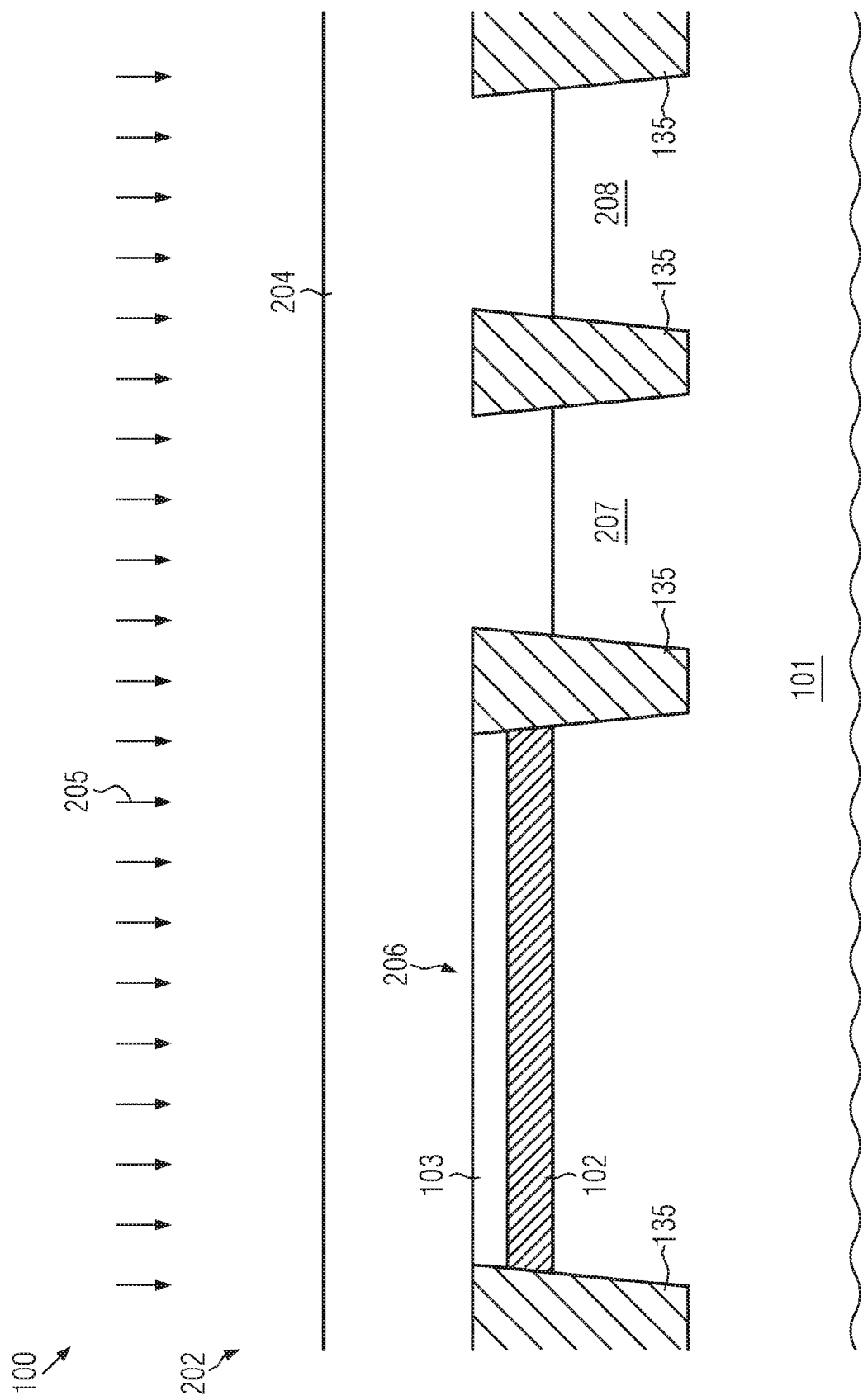
Figure 2C:
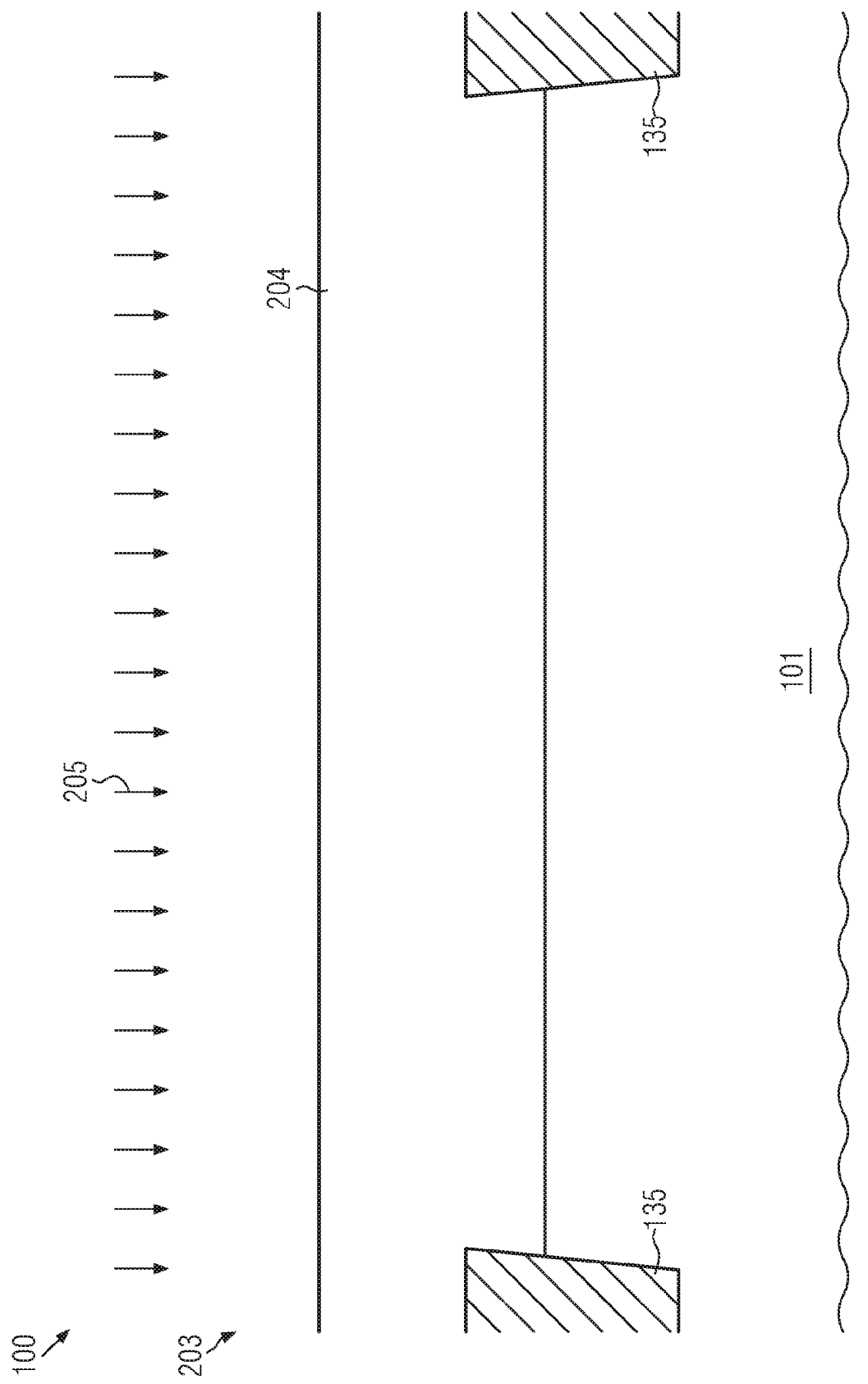

FIG. 2a shows a schematic cross-sectional view of a portion of the semiconductor structure 100 including a transistor region 201 wherein the transistor 104 described above with reference to FIGS. 1a and 1b will be formed in a stage of a method of manufacturing a semiconductor structure according to an embodiment. Other portions of the semiconductor structure 100 at the stage of the manufacturing process shown in FIG. 2a are shown in FIGS. 2b and 2c. FIG. 2b shows a transistor region 202 wherein a core device transistor 612 (see FIG. 6b), which may be a logic transistor, will be formed, and FIG. 2c shows a resistor region 203 wherein a diffusion resistor 613 (see FIG. 6c) will be formed. For convenience, in the following, embodiments will be described wherein the transistor 104 formed at the transistor region 201 is an N-channel transistor, the transistor 612 formed at the transistor region 202 is also an N-channel transistor, and the diffusion resistor 613 formed at the resistor region 203 is an N-doped diffusion resistor. Similar techniques may be used in embodiments wherein the transistors formed at the transistor regions 201, 202 are P-channel transistors and/or wherein the diffusion resistor formed at the resistor region 203 is a P-doped diffusion resistor. In such embodiments, some of the process steps described in the following may be modified, as will be described in more detail below.

The semiconductor-on-insulator structure including the substrate 101, the electrically insulating layer 102 and the active layer 103 of semiconductor material may be provided. The semiconductor-on-insulator structure may be obtained from a third party vendor, or it may be manufactured in-house using known techniques for the formation of semiconductor-on-insulator wafers. In some embodiments, the active layer 103 of semiconductor material may be thinned by means of chemical mechanical polishing and/or etching for obtaining a small thickness of the active layer 103 of semiconductor material in accordance with fully depleted semiconductor-on-insulator techniques.

The trench isolation structure 135 may be formed using known techniques for the formation of trench isolation structures including photolithography, etching, oxidation, deposition and/or chemical mechanical polishing.

In addition to the portions of the trench isolation structure 135 described above with reference to FIGS. 1a and 1b, the trench isolation structure 135 may include portions separating an active region 206 of the transistor formed at the transistor region 202 from portions of the semiconductor structure 100 wherein a back gate contact region 207 and a bulk contact region 208 of the transistor formed at the transistor region 202 will be formed. Additionally, the trench isolation structure 135 may include portions separating each of the transistors formed at the transistor regions 201, 202 and the diffusion resistor formed at the resistor region 203 from other circuit elements (not shown) in the semiconductor structure 100.

After the formation of the trench isolation structure 135, portions of the electrically insulating layer 102 and the active layer 103 of semiconductor material over the gate contact region 114, the isolation junction region 117 and the bulk contact region 120 in the transistor region 201, portions of the electrically insulating layer 102 and the active layer 103 of semiconductor material over the back gate contact region 207 and the bulk contact region 208 in the transistor region 202, and portions of the electrically insulating layer 102 and the active layer 103 of semiconductor material over the resistor region 203 may be removed. This may be done by means of techniques of photolithography and etching.

Thereafter, a deep well implantation mask 204 may be formed over the semiconductor structure 100. The deep well implantation mask 204 may be a photoresist mask, and it may be formed by means of techniques of photolithography. The deep well implantation mask 204 may cover the bulk contact region 120 in the transistor region 201, and it may cover the transistor region 202 and the resistor region 203. Portions of the semiconductor structure 100 where the deep well region 112 is to be formed are not covered by the deep well implantation mask 204. In particular, the deep well implantation mask 204 need not cover the active region 105, the gate contact region 114 and the isolation junction contact region 117.

After the formation of the deep well implantation mask 204, a deep well ion implantation process 205 may be performed, wherein the semiconductor structure 100 is irradiated with ions of a dopant adapted for providing the second type of doping of the deep well region 112, for example, ions of an N-type dopant. An energy of the ions used in the deep well ion implantation process 205 may be adapted such that a majority of those ions that are not absorbed by the deep well implantation mask 204 come to rest in the substrate 101 in the area wherein the deep well region 112 is provided. The deep well implantation mask 204 may absorb substantially all ions impinging on the deep well implantation mask 204, so that no deep well region is formed in portions of the semiconductor structure covered by the deep well implantation mask 204.

Figure 3B:
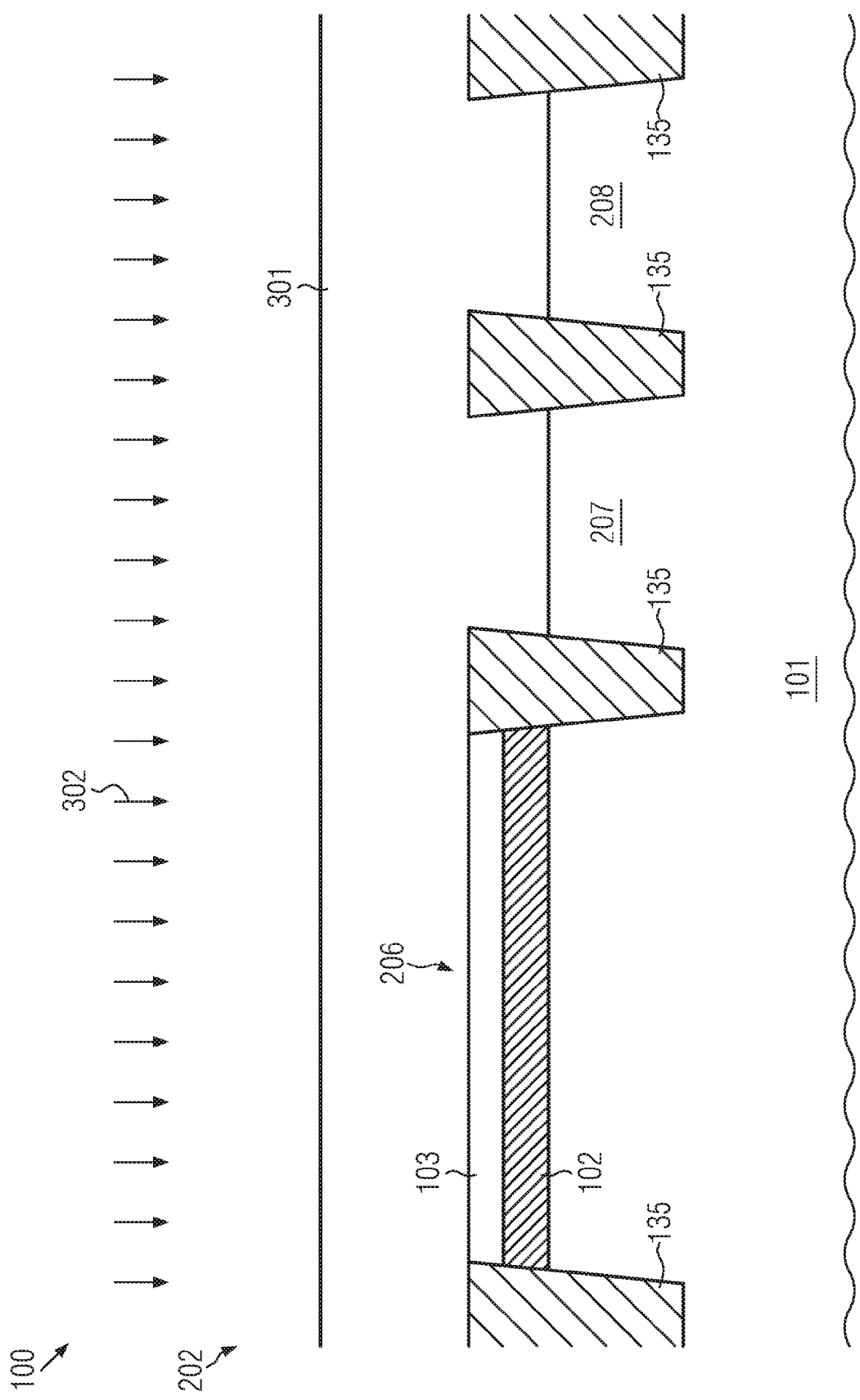

FIGS. 3a, 3b and 3c show the transistor region 201, the transistor region 202 and the resistor region 203, respectively, in a later stage of the manufacturing process. After the deep well ion implantation process 205, the deep well implantation mask 204 may be removed by means of a resist strip process. Then, a sidewall well implantation mask 301 may be formed. The sidewall well implantation mask 301 may be a photoresist mask, and it may be formed by means of a photolithography process. The sidewall well implantation mask 301 may cover portions of the semiconductor structure 100 other than those wherein the sidewall well region 113 is provided. The sidewall well implantation mask 301 may cover the active region 105, the gate contact region 114 and the bulk contact region 120 in the transistor region 201, and it may completely cover the transistor region 202 and the resistor region 203. The sidewall well implantation mask 301 does not cover the isolation junction contact region 117.

After the formation of the sidewall well implantation mask 301, a sidewall well ion implantation process 302 may be performed, wherein the semiconductor structure is irradiated with ions of a dopant of the second type of doping. An ion energy used in the sidewall well ion implantation process 302 may be adapted such that a majority of those ions that are not absorbed by the sidewall well implantation mask 301 come to rest in the substrate 101 at depths wherein the sidewall well region 113 is to be formed. In some embodiments, the ion energy may be varied during the sidewall well ion implantation process 302 to obtain a desired dopant profile along the depth direction of the sidewall well region 113.

After the sidewall well ion implantation process 302, the semiconductor structure 100 includes the isolation junction region 110 in the transistor region 201, which defines the bulk region 111 that includes portions of the substrate 101 having a doping corresponding to a base doping of the substrate 101 that are not enclosed by the isolation junction region 110.

Figure 4A:
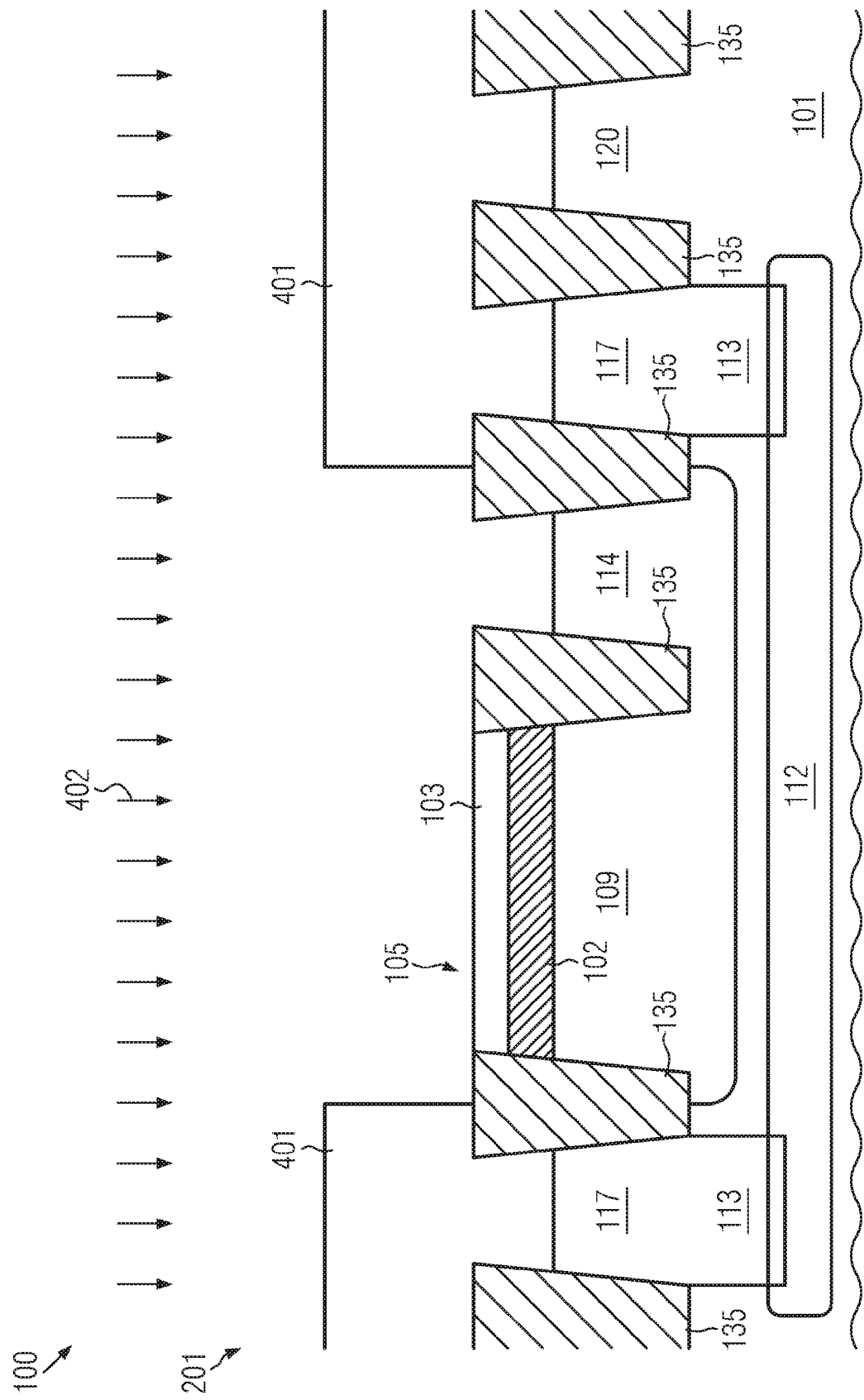
Figure 4C:
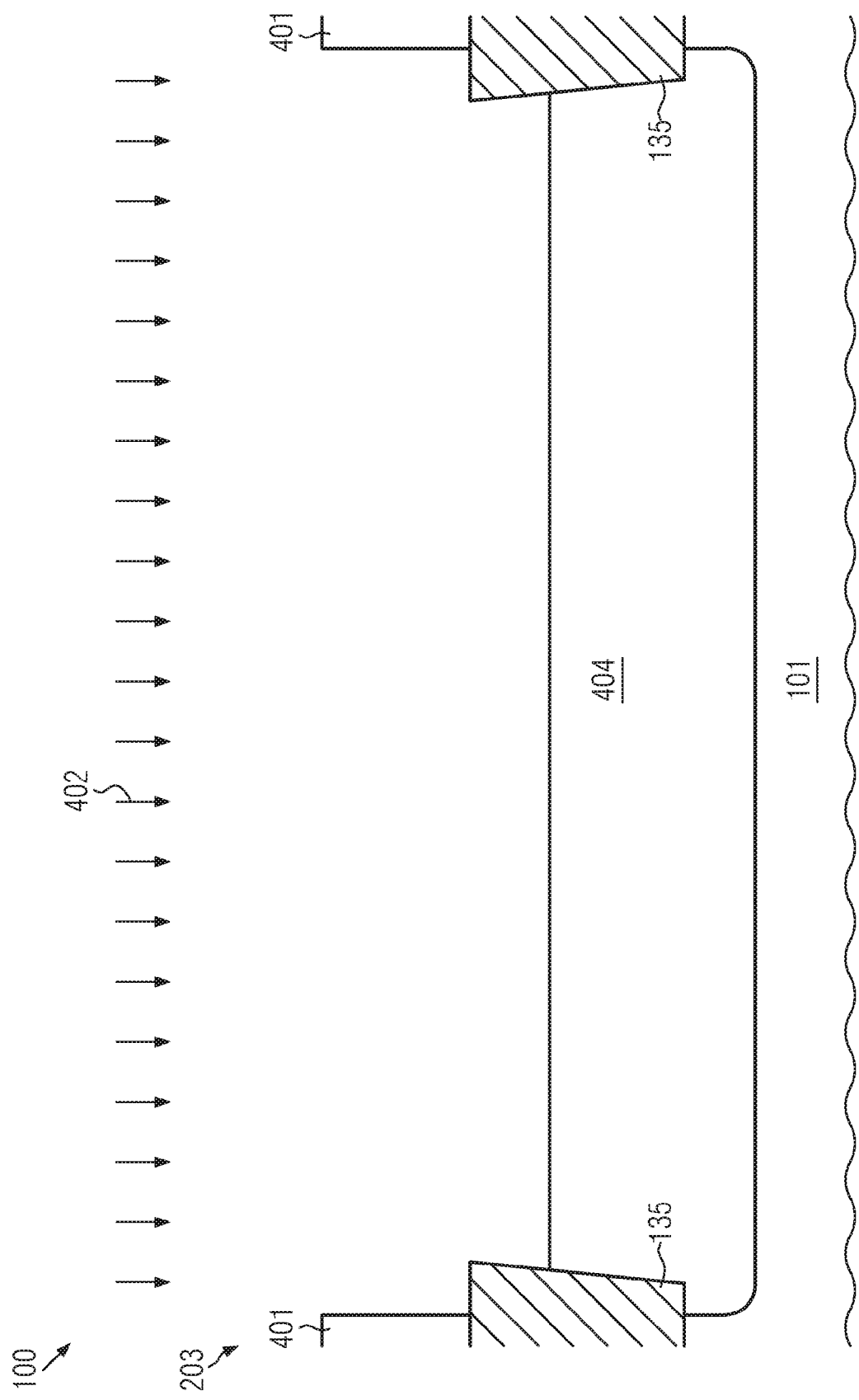

FIGS. 4a, 4b and 4c show schematic cross-sectional views of the transistor region 201, the transistor region 202 and the resistor region 203, respectively, in a later stage of the manufacturing process.

After the sidewall well ion implantation process 203, the sidewall well implantation mask 301 may be removed by means of a resist strip process, and a back gate implantation mask 401 may be formed over the semiconductor structure 100. The back gate implantation mask may cover portions of the transistor region 201 other than those wherein the gate electrode region 109 is to be formed. In particular, the back gate implantation mask 401 may cover the isolation junction contact regions 117 and the bulk contact region 120.

Furthermore, the back gate implantation mask 401 may cover portions of the transistor region 202 with the exception of those portions wherein a back gate region 403 of the transistor to be formed in the transistor region 202 is provided. In particular, the back gate implantation mask 401 may cover the bulk contact region 208 in the transistor region 202.

The back gate implantation mask 401 does not cover the resistor region 203, wherein a resistor well region 404 will be provided.

After the formation of the back gate implantation mask 401, a back gate ion implantation process 402 may be performed. In the back gate ion implantation process 402, the semiconductor structure 100 may be irradiated with ions of a dopant of the first type of doping. In the back gate ion implantation process 402, the gate electrode region 109 may be formed in the transistor region 201, the back gate region 403 may be formed in the transistor region 202, and the resistor well region 404 may be formed in the resistor region 203. An energy of the ions used in the back gate ion implantation process 402 may be adapted such that a majority of those ions that are not absorbed by the back gate implantation mask 401 come to rest in the substrate 101 in portions wherein the gate electrode region 109, the back gate region 403 and the resistor well region 404 are to be provided. In some embodiments, the ion energy may be varied during the back gate ion implantation process 402 to obtain a desired dopant profile along the depth direction of the gate electrode region 109, the back gate region 403 and the resistor well region 404.

In some embodiments, a plurality of back gate ion implantation processes may be performed, which may include a pre-gate implantation process for conversion of super-low threshold voltage core device transistors to low threshold voltage core device transistors, and wherein dopants may also be implanted into the gate electrode region 109.

Moreover, in some embodiments, the above-described ion implantation processes and the formation of the corresponding implantation masks may be performed in a different order. For example, the formation of the sidewall implantation mask 301 and the sidewall well ion implantation process 302 may be performed after the formation of the back gate implantation mask 401 and the back gate ion implantation process 402.

Figure 5A:
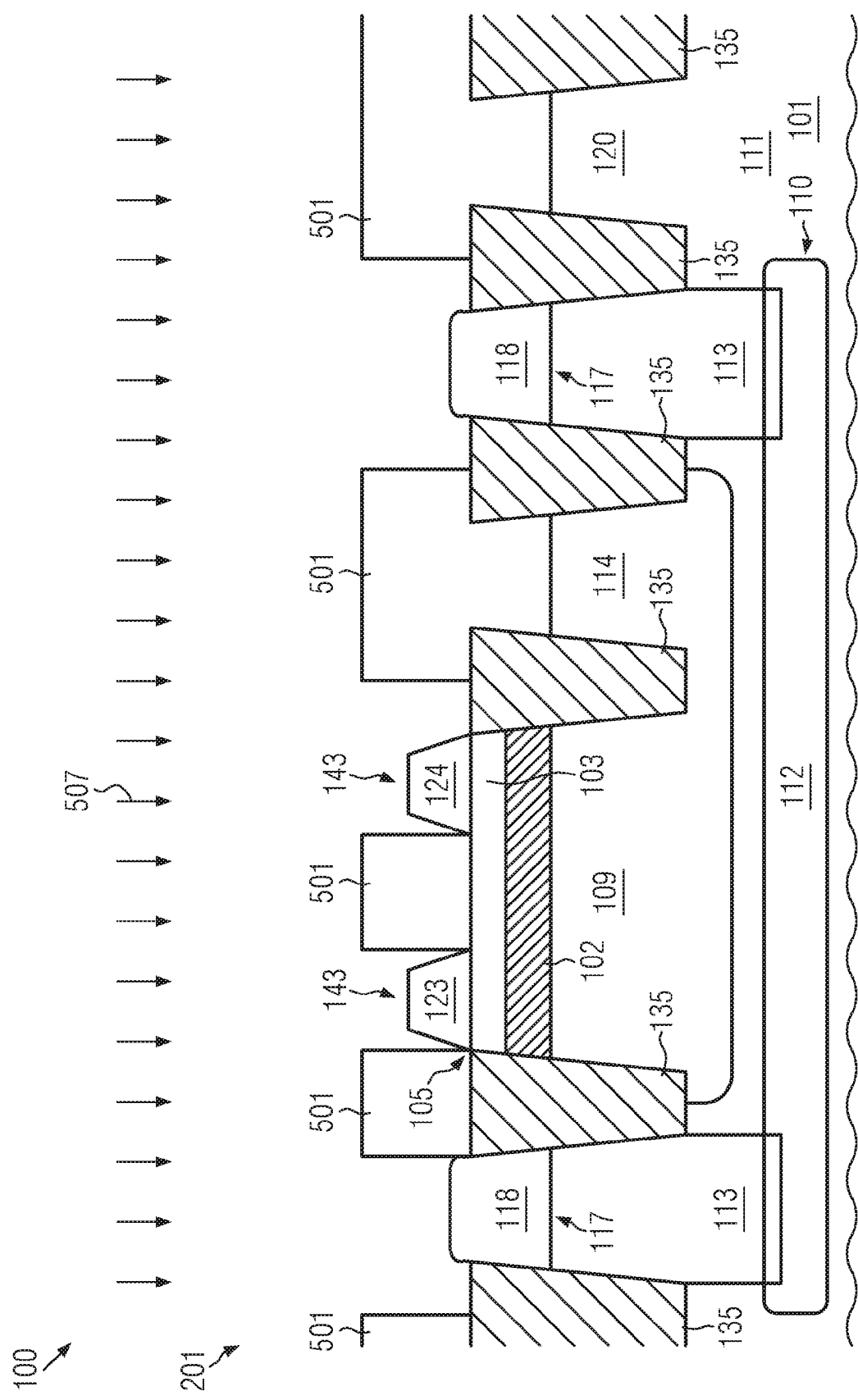
Figure 5B:
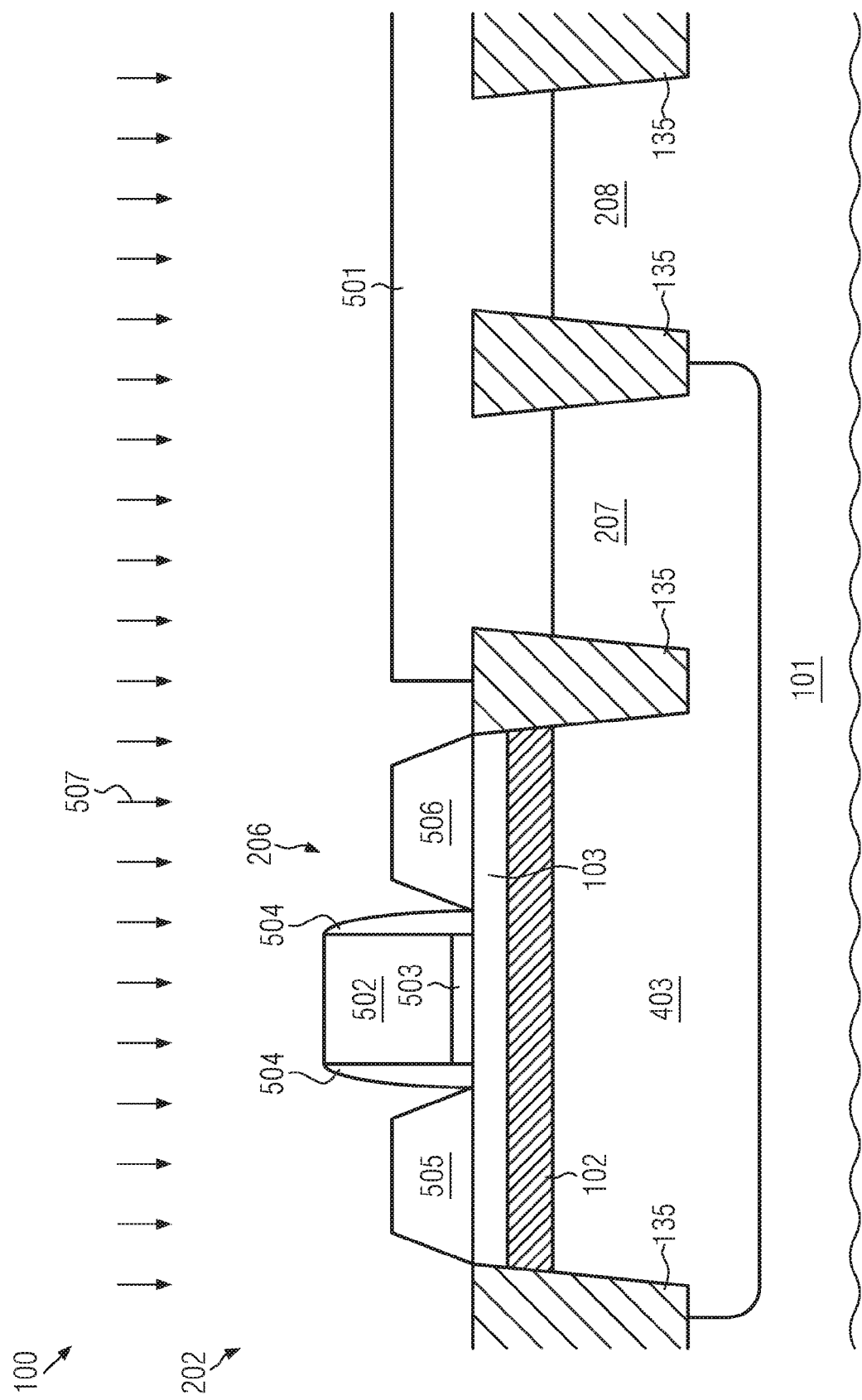

FIGS. 5a, 5b, and 5c show schematic cross-sectional views of the transistor region 201, the transistor region 202, and the resistor region 203, respectively, in a later stage of the manufacturing process.

After the back gate ion implantation process 402, the back gate implantation mask 401 may be removed by means of a resist strip process, and a gate insulation layer 503, a gate electrode 502, and a sidewall spacer 504 may be formed over the active region 206 in the transistor region 202. The gate insulation layer 503, the gate electrode 502 and the sidewall spacers 504 shown in FIG. 5b are of a schematic nature only. Features of the gate electrode 502, the gate insulation layer 503, and the sidewall spacer 504 may correspond to features of gate electrodes, gate insulation layers and sidewall spacers conventionally employed in core device transistors that are formed in accordance with fully depleted semiconductor-on-insulator technologies. For forming the gate electrode 502, the gate insulation layer 503 and the sidewall spacer 504, known techniques, which may include a deposition of a gate stack including layers of materials of the gate electrode 502 and the gate insulation layer 503 over the semiconductor structure 100, and patterning the gate stack by means of techniques of photolithography and etching, may be used. The sidewall spacer 504 may be formed by means of techniques including a substantially isotropic deposition of one or more sidewall spacer materials and an anisotropic etch process to remove portions of the layers of sidewall spacer material over substantially horizontal portions of the semiconductor structure 100.

Over the transistor region 201, no gate electrode, gate insulation layer and sidewall spacer are formed. Instead, portions of the gate stack deposited over the transistor region 201 may be removed in the patterning of the gate stack. Furthermore, portions of the gate stack deposited over the resistor region 503 may be removed.

Thereafter, an epitaxy block mask 501 may be formed over the semiconductor structure 100. The epitaxy block mask 501 may be formed by depositing a layer of a material of the epitaxy block mask 501, for example, a silicon nitride layer, over the semiconductor structure 100 and patterning the layer of the material of the epitaxy block mask 501 by means of techniques of photolithography and etching. The epitaxy block mask 501 may cover portions of the semiconductor structure 100 wherein no semiconductor material having a doping in accordance with the type of the transistors formed at the transistor regions 201, 202 is to be deposited. In embodiments wherein the transistors to be formed at the transistor regions 201, 202 are N-channel field effect transistors, the epitaxy block mask 501 may cover portions of the semiconductor structure 100 wherein no N-doped semiconductor material is to be deposited, which include portions of the semiconductor structure 100 wherein a P-doped semiconductor material is to be deposited and portions of the semiconductor structure 100 wherein no semiconductor material at all is to be deposited.

In the transistor region 201, portions of the epitaxy block mask 501 may be provided over a portion of the active region 105 wherein the channel region of the transistor 104 to be formed in the transistor region 201 will be provided, as well as the gate electrode contact region 114 and the bulk contact region 120.

However, the epitaxy block mask 501 does not cover portions of the active region 105 wherein the source region 106 and the drain region 108 of the transistor 104 will be provided, over which the raised source region 123 and the raised drain region 124 will be formed. Furthermore, the epitaxy block mask 501 need not cover the isolation junction contact region 117, wherein the portions 118 of the isolation junction contact region will be formed. In FIG. 1b, locations of openings 143 in the epitaxy block mask 501 over portions of the active region 105 wherein the source region 106 and the drain region 108 will be formed are shown by dashed lines.

In the transistor region 202, the epitaxy block mask 501 may cover the back gate contact region 207 and the bulk contact region 208. However, the epitaxy block mask 501 need not cover portions over the active region 206 of the transistor to be formed at the transistor region 202, since the gate electrode 502 and the sidewall spacer 504 can block a deposition of semiconductor material over the part of the active region 206 wherein a channel region will be formed.

Furthermore, the epitaxy block mask 501 need not cover the resistor region 203.

Further portions of the epitaxy block mask 501 may be provided over portions of the semiconductor structure 100 wherein source and drain regions of transistors of the type opposite to the type of the transistors formed at the transistor regions 201, 202, for example P-channel transistors, will be formed.

After the formation of the epitaxy block mask 501, a selective epitaxial growth process 507 may be performed. The selective epitaxial growth process 507 may be adapted to selectively deposit a doped semiconductor material, for example, N-doped semiconductor material, such as N-doped silicon, over portions of the semiconductor structure 100 where the semiconductor material of the active layer 103 of semiconductor material is exposed at the surface of the semiconductor structure 100. Over portions of the semiconductor structure 100 wherein materials other than semiconductor material of the active layer 103, in particular materials other than silicon, are exposed at the surface of the semiconductor structure 100, substantially no deposition of doped semiconductor material or only a deposition of a relatively small amount of doped semiconductor material may occur in the selective epitaxial growth process 507.

In the selective epitaxial growth process 507, the raised source region 123 and the raised drain region 124 of the transistor 104 may be formed. Since portions of the active region 105 wherein the channel region 107 will be formed are covered by the epitaxy block mask 501, the raised source region 123 and the raised drain region 124 do not extend over the channel region of the transistor 104. Additionally, in the selective epitaxial growth process 507, the portions 118 of the isolation junction contact region 117 may be formed.

In the transistor region 202, the selective epitaxial growth process 507 may form a raised source region 505 and a raised drain region 506 over portions of the active region 206 adjacent to the gate electrode 502 and the sidewall spacer 504.

In the resistor region 203, the selective epitaxial growth process 507 may form a layer of doped semiconductor material 508 over the resistor well region 404, wherein the layer 508 of doped semiconductor material is doped oppositely to the doping of the resistor well region 404.

Figure 6A:
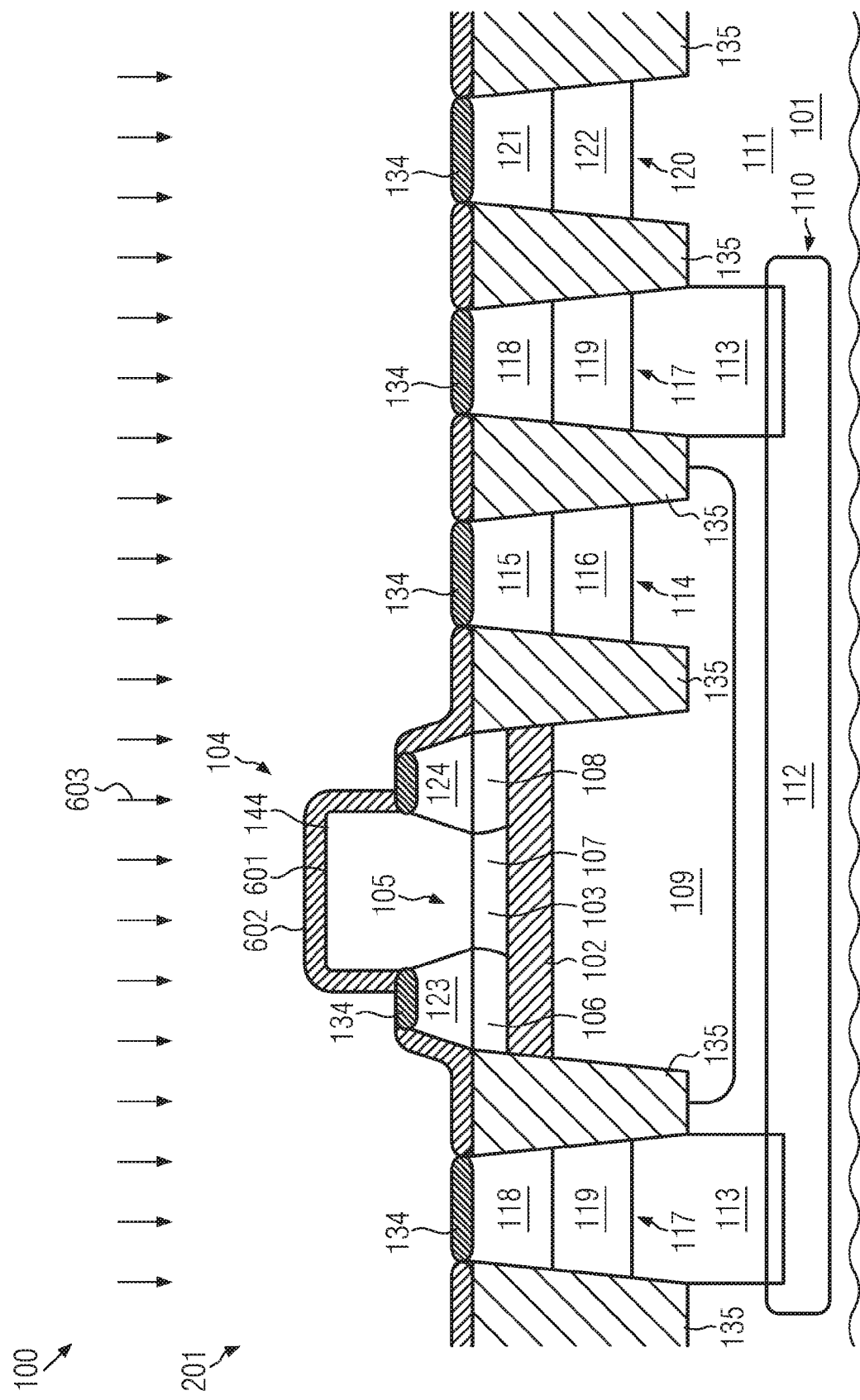

FIGS. 6a, 6b, and 6c show schematic cross-sectional views of the transistor region 201, the transistor region 202, and the resistor region 203, respectively, of the semiconductor structure 100 in later stages of the manufacturing process.

After the selective epitaxial growth process 507, the epitaxy block mask 501 may be removed by means of an etch process adapted to selectively remove the material of the epitaxy block mask 501. Thereafter, another epitaxy block mask (not shown) covering portions of the semiconductor structure 100 wherein no doped semiconductor material having a type of doping opposite to the type of doping of the semiconductor material deposited by the selective epitaxial growth process 507 is to be deposited. In particular, portions of the transistor region 201 other than the gate contact region 114 and the bulk contact region 120, portions of the transistor region 202 other than the back gate contact region 207 and the bulk contact region 208, as well as the resistor region 203 may be covered by the epitaxy block mask. Thereafter, a selective epitaxial growth process adapted for depositing doped semiconductor material having a type of doping opposite to the type of doping of the semiconductor material deposited by the selective epitaxial growth process 507 may be performed. This selective epitaxial growth process may form the portion 115 of the gate contact region 114, the portion 121 of the bulk contact region 120, and portions 607, 609 of the back gate contact region 207 and the bulk contact region 208, respectively.

Thereafter, the epitaxy block mask may be removed, and an annealing process may be performed for diffusing dopants from the doped semiconductor materials deposited by the selective epitaxial growth processes into portions of the semiconductor structure 100 therebelow. Furthermore, dopants implanted into the gate electrode region 109, the isolation junction region 110, the back gate region 403, and the resistor well region 404 may be activated by the annealing process.

In the transistor region 201, the diffusion of dopants may create the source region 106 and the drain region 108 of the transistor 104, and the portions 116, 119, 122 of the gate contact region 114, the isolation junction contact region 117 and the bulk contact region 120, respectively. Furthermore, in the transistor region 202, a source region 604 and a drain region 606, as well as portions 608, 610 of the back gate contact region 207 and the bulk contact region 208, respectively, may be formed. Portions of the active region 206 below the gate electrode 502 may remain substantially undoped, or may receive only a relatively small amount of dopants from the raised source region 505 and the raised drain region 506, so that a channel region 605 is provided between the source region 604 and the drain region 606. Thus, a transistor 612 may be provided at the transistor region 202.

In the resistor region 203, dopants from the doped layer 508 of semiconductor material can diffuse into portions of the substrate 101 there below, and can form a dopant diffusion region 611 having a type of doping opposite to the type of doping of the resistor well region 404.

After the diffusion of dopants, a silicide block mask 601 may be formed over the semiconductor structure 100. The silicide block mask 601 may be a hard mask, and it may be formed by depositing a layer of a hard mask material, for example, silicon nitride over the semiconductor structure 100 and patterning the layer of hard mask material by techniques of photolithography and etching. The silicide block mask 601 may cover portions of the semiconductor structure 100 wherein no silicide is to be formed. In particular, the silicide block mask 601 may have a portion 144 over the channel region 107 of the transistor 104 at the transistor region 201, whose location is denoted by dash-dotted lines in FIG. 1b. Additionally, a portion of the silicide block mask 601 may be provided at the resistor region 203. The portion of the silicide block mask 601 at the resistor region 203 may cover portions of the resistor region 203 other than portions of the resistor region where contacts to the diffusion resistor 613 formed at the resistor region 203 will be formed.

After the formation of the silicide block mask 601, a silicidation process may be performed. The silicidation process may include a deposition of a metal layer 602, for example a nickel layer, over the semiconductor structure 100, and one or more annealing processes 603 that are adapted for inducing a chemical reaction between the metal of the metal layer 602, which may be nickel, and semiconductor material below the metal layer 602. In the chemical reaction, the silicide regions 134 may be formed. Portions of the metal layer 602 which do not react with semiconductor material may be removed by means of an etch process in later stages of the manufacturing process. The silicide block mask 601 may prevent a formation of silicide in the channel region 107 of the transistor 104, and in portions of the resistor 613 other than those wherein contacts to the resistor 613 are to be formed.

After the silicidation process and the removal of unreacted portions of the metal layer 602, the interlayer dielectrics 125, 136, the contacts 126 to 133, the electrically conductive lines 137 to 142, and further contacts and electrically conductive lines providing connections to the transistor 612 and the resistor 613 may be formed by means of known middle-of-line and back-end-of-line processes.

The present disclosure is not limited to embodiments wherein the transistor 104 is an N-channel transistor. In other embodiments, the transistor 104 may be a P-channel transistor, wherein the source region 106 and the drain region 108 are P-doped. The channel region 107 may be P-doped, wherein a dopant concentration in the channel region 107 may be smaller than a dopant concentration in the source region 106 and the drain region 108, or the channel region 107 may be N-doped, so that the channel region 107 is doped inversely to the doping of the source region 106 and the drain region 108. For providing the doping of the source region 106 and the drain region 108, in such embodiments, the raised source region 123 and the raised drain region 124 may be formed by epitaxially depositing a P-doped semiconductor material and diffusing dopants from the raised source region 123 and the raised drain region 124 into portions of the active layer 103 of semiconductor material there below.

The gate electrode region 109 may be N-doped, and it may be formed by means of ion implantation. For providing an electrical insulation of the gate electrode region 109, a P-doped region which may have a doping corresponding to the base doping of the substrate 101 may be provided between the N-doped deep well region 112 and the gate electrode region 109, so that there is a PN-transition at both sides of the N-doped isolation junction region 110. For this purpose, a relatively shallow gate electrode region 109 may be provided, and very shallow trench isolation structure that is shallower than portions of the trench isolation structure 135 between the gate electrode contact region 114 and the isolation junction contact region 117, and portions of the trench isolation structure 135 between the isolation junction contact region 117 and the bulk contact region 120 may be formed between the gate electrode region 109 and the gate electrode contact region 114.

Figure 7:
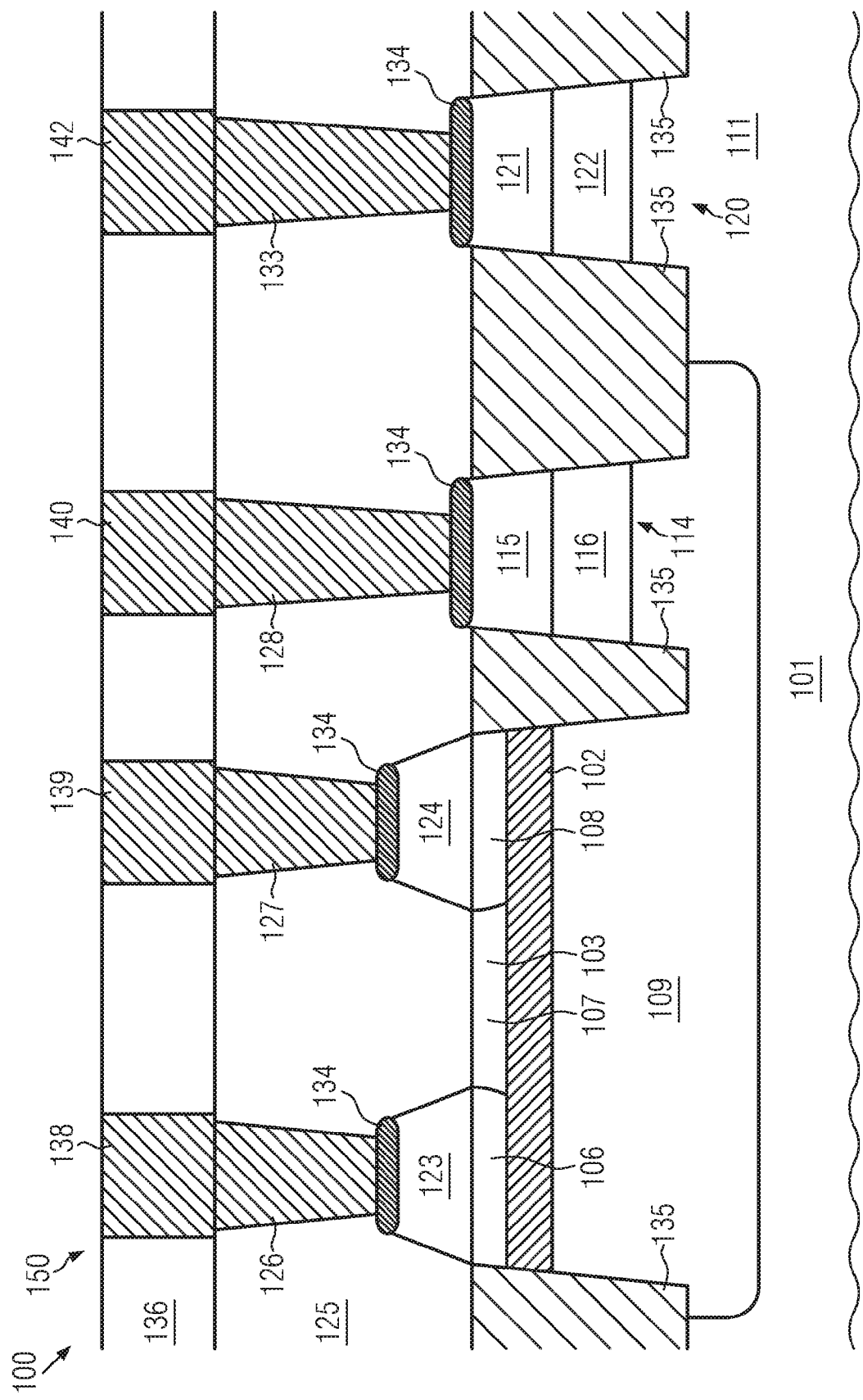
FIG. 7 shows a schematic cross-sectional view of a portion of the semiconductor structure wherein another transistor is provided.

In other embodiments, depletion P-channel transistors and/or high voltage P-channel transistors may be formed without an isolation junction region 110. An example of such a P-channel transistor 150 is shown in FIG. 7. For convenience, in FIG. 7, reference numerals corresponding to the reference numerals used in FIGS. 1a-6c have been used to denote like components. Unless explicitly indicated otherwise, components denoted by like reference numerals may have corresponding features, and corresponding methods may be used for the formation thereof.

The transistor 150 may include an active region including P-doped source 106 and drain 108 regions and a channel region 107, which may be formed in the active layer 103 of semiconductor material that is separated from the substrate 101 by the electrically insulating layer 102. Over the source region 106, a raised source region 123 may be formed, and a raised drain region 124 may be formed over the drain region 108.

In the substrate, an N-doped gate electrode region 109 may be provided, wherein there is a PN-transition between the gate electrode region 109 and a P-doped bulk region 111 adjacent the gate electrode region 109. The bulk region 109 may have a doping corresponding to a base doping of the substrate 101.

The transistor 150 may additionally include an N-doped gate electrode contact region 114 including portions 115, 116, wherein the portion 115 may be formed by selective epitaxial growth of an N-doped semiconductor material and the portion 116 may be formed by diffusion of dopants from the portion 115.

Additionally, a P-doped bulk contact region 120 including portions 121, 122 may be provided, wherein the portion 121 may be formed by selective epitaxial growth of a P-doped semiconductor material and the portion 122 may be formed by diffusion of dopants from the portion 121.

In the raised source region 123, the raised drain region 124, the gate electrode contact region 114 and the bulk contact region 120, a silicide 134 may be provided. Contacts 126, 127, 128, 133 formed in an interlayer dielectric 125 may provide an electrical connection between the raised source region 123, the raised drain region 124, the gate electrode contact region 114 and the bulk contact region 120, respectively, and electrically conductive lines 138, 139, 140 and 142, respectively, that are formed in an interlayer dielectric 136.

For forming the transistor 150, techniques as described above with reference to FIGS. 2a-6c may be used, wherein no additional processing steps need to be performed for forming a shallow gate electrode region and a very shallow trench isolation structure between the shallow gate electrode region and a gate electrode contact region, and no additional photomasks need to be provided.

In the operation of the transistor 150, mass potential may be applied to the bulk contact 133, and voltages approximately equal to mass potential or greater may be applied to the gate contact 128, so that the PN-transition between the gate electrode region 109 and the bulk region 111 is inversely biased. For example, in embodiments wherein the transistor 150 is a depletion transistor, a voltage of about 0 V may be applied to the gate contact 128 for obtaining an on-state of the transistor 150, and a voltage of about +0.8 V or more may be applied to the gate contact 128 for obtaining an off-state of the transistor 150. Adjustments of an on-current of the transistor 150 so that a greater on-current is obtained may be performed by adjusting a ratio between a width and a length of the channel region 107, since applying a negative voltage to the gate electrode region 109 might lead to relatively high leakage current through the PN-transition between the gate electrode region 109 and the bulk region 111.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor structure, comprising:
   a bulk semiconductor substrate comprising a bulk semiconductor material, an electrically insulating layer over said bulk semiconductor substrate and an active layer of semiconductor material over said electrically insulating layer;
   a trench isolation structure positioned in said bulk semiconductor material comprising said bulk semiconductor substrate and defining said active region of said transistor; and
   a transistor, comprising:
      an active region provided in said active layer of semiconductor material, said active region comprising a source region, a channel region and a drain region, wherein said trench isolation structure extends into said bulk semiconductor material comprising said bulk semiconductor substrate to a first depth below an upper surface of said active region; and a gate electrode region positioned in a first portion of said bulk semiconductor material comprising said bulk semiconductor substrate and having a first type of doping, at least a portion of said gate electrode region being arranged directly below a portion of said electrically insulating layer below said channel region, wherein said transistor does not comprise a gate electrode other than said gate electrode region positioned in said bulk semiconductor material comprising said bulk semiconductor substrate, wherein said gate electrode region extends into said bulk semiconductor material comprising said bulk semiconductor substrate to a second depth below said upper surface of said active region that is greater than said first depth.

2. The semiconductor structure of claim 1, further comprising an isolation junction region formed in said bulk semiconductor material comprising said bulk semiconductor substrate, said isolation junction region having a second type of doping opposite said first type of doping and separating said gate electrode region from a second portion of said bulk semiconductor material comprising said bulk semiconductor substrate surrounding said gate electrode region and having said first type of doping, wherein a PN-transition is formed at least between said gate electrode region and said isolation junction region.

3. The semiconductor structure of claim 2, wherein said isolation junction region comprises:
a deep well region below said gate electrode region; and
a sidewall well region annularly enclosing said gate electrode region, said sidewall well region being continuous with said deep well region.

4. The semiconductor structure of claim 3, further comprising a gate electrode contact region at a portion of said gate electrode region adjacent said active region, said gate electrode contact region having a higher dopant concentration of said first type of doping than said at least a portion of said gate electrode region directly below said portion of said electrically insulating layer below said channel region.

5. The semiconductor structure of claim 4, wherein said transistor further comprises a raised source region over said source region and a raised drain region over said drain region, wherein said raised source region and said raised drain region substantially do not extend over said channel region.

6. The semiconductor structure of claim 5, further comprising:
an interlayer dielectric over said transistor;
a source contact extending though said interlayer dielectric and electrically connected to said raised source region;
a drain contact extending through said interlayer dielectric and electrically connected to said raised drain region; and
a gate contact extending through said interlayer dielectric and electrically connected to said gate electrode contact region.

7. The semiconductor structure of claim 5, wherein said raised source region, said source region, said raised drain region and said drain region have said second type of doping, and said transistor is one of a depletion transistor and a high voltage transistor.

8. The semiconductor structure of claim 6, further comprising:
an isolation junction contact region at said sidewall well region having a higher dopant concentration of said second type of doping than portions of said sidewall well region below said isolation junction contact region;
one or more isolation junction contacts, each isolation junction contact extending through said interlayer dielectric and being electrically connected to said isolation junction contact region;
a bulk contact region having said first type of doping and being continuous with said second portion of said bulk semiconductor material comprising said bulk semiconductor substrate having said first type of doping, a dopant concentration of said bulk contact region being greater than a dopant concentration of said second portion of said bulk semiconductor material comprising said bulk semiconductor substrate having said first type of doping; and
a bulk contact extending through said interlayer dielectric and being electrically connected to said bulk contact region.

9. The semiconductor structure of claim 7, further comprising at least one of a core device transistor and a diffusion resistor.

10. The semiconductor structure of claim 8, wherein each of said raised source region, said raised drain region, said gate electrode contact region, said isolation junction contact region and said bulk contact region comprises a silicide, wherein substantially no silicide is formed in said channel region.

11. The semiconductor structure of claim 8 wherein said trench isolation structure separates said active region, said gate electrode contact region, said isolation junction contact region and said bulk contact region from each other.

12. A method, comprising:
providing a semiconductor structure comprising a bulk semiconductor substrate, an electrically insulating layer over said bulk semiconductor substrate and an active layer of semiconductor material over said electrically insulating layer, said bulk semiconductor substrate comprising a bulk semiconductor material;
forming a first transistor, the formation of said first transistor comprising:
forming a gate electrode region in a first portion of said bulk semiconductor material comprising said bulk semiconductor substrate, said gate electrode region having a first type of doping, at least a portion of said gate electrode region being arranged directly below said electrically insulating layer; and
forming an active region of said first transistor in said active layer of semiconductor material, said active region of said first transistor comprising a source region, a channel region and a drain region of said first transistor, wherein at least said channel region of said first transistor is provided above said at least a portion of said gate electrode region that is arranged directly below said electrically insulating layer;
wherein no gate electrode of said first transistor is formed on a side of said active layer of semiconductor material opposite said bulk semiconductor substrate.

13. The method of claim 12, further comprising forming an isolation junction region in said bulk semiconductor material comprising said bulk semiconductor substrate, said isolation junction region having a second type of doping opposite said first type of doping and separating said gate electrode region from a second portion of said bulk semiconductor material comprising said bulk semiconductor substrate surrounding said gate electrode region.

14. The method of claim 13, further comprising:
forming a second transistor, the formation of said second transistor comprising:
forming a back gate region in a third portion of said bulk semiconductor material comprising said bulk semiconductor substrate, said back gate region having said first type of doping, at least a portion of said back gate region being arranged directly below a portion of said electrically insulating layer;
forming a gate electrode of said second transistor over said active layer of semiconductor material and said back gate region, said gate electrode of said second transistor being arranged on said side of said active layer of semiconductor material opposite said bulk semiconductor substrate; and
forming a source region and a drain region of said second transistor in said active layer of semiconductor material adjacent said gate electrode of said second transistor, a portion of said active layer of semiconductor material below said gate electrode of said second transistor providing a channel region of said second transistor;
wherein the formation of said back gate region and said gate electrode region comprises performing a common back gate ion implantation process wherein ions of a dopant of said first type of doping are implanted into said first and third portions of said bulk semiconductor material comprising said bulk semiconductor substrate.

15. The method of claim 14, further comprising:
forming an epitaxy block mask over said active layer of semiconductor material, said epitaxy block mask defining said channel region of said first transistor;
after the formation of said epitaxy block mask, performing a selective epitaxial growth process depositing a doped semiconductor material, wherein a raised source region of said first transistor, a raised drain region of said first transistor, a raised source region of said second transistor and a raised drain region of said second transistor are formed, said epitaxy block mask substantially preventing a deposition of semiconductor material over said channel region of said first transistor;
diffusing dopants from said raised source region of said first transistor into said active layer of semiconductor material, wherein said source region of said first transistor is formed;
diffusing dopants from said raised source region of said second transistor into said active layer of semiconductor material, wherein said source region of said second transistor is formed;
diffusing dopants from said raised drain region of said first transistor into said active layer of semiconductor material, wherein said drain region of said first transistor is formed; and
diffusing dopants from said raised drain region of said second transistor into said active layer of semiconductor material, wherein said drain region of said second transistor is formed.

16. The method of claim 15, further comprising forming a diffusion resistor, the formation of said diffusion resistor comprising:
before said selective epitaxial growth process, removing a portion of said active layer of semiconductor material and a portion of said electrically insulating layer from a resistor region wherein a fourth portion of said bulk semiconductor material comprising said bulk semiconductor substrate in said resistor region is exposed, said selective epitaxial growth process depositing said doped semiconductor material over said resistor region; and
diffusing dopants from said doped semiconductor material deposited over said resistor region into said fourth portion of said bulk semiconductor material comprising said bulk semiconductor substrate.

17. The method of claim 16, further comprising:
forming a silicide block mask over said channel region of said first transistor and over a first part of said resistor region;
after the formation of said silicide block mask, performing a silicidation process wherein a silicide is formed at said raised source region of said first transistor, said raised drain region of said first transistor, said raised source region of said second transistor, said raised drain region of said second transistor and one or more second parts of said resistor region that are not covered by said silicide block mask, said silicide block mask substantially preventing a formation of silicide in said channel region of said first transistor.

18. The method of claim 17, wherein the formation of said isolation junction region comprises:
performing a deep well ion implantation wherein a deep well region having said first type of doping is formed in said bulk semiconductor material comprising said bulk semiconductor substrate below said gate electrode region; and
performing a sidewall well ion implantation wherein a sidewall well region is formed over said deep well region and annularly surrounding said gate electrode region;
said deep well region and said sidewall well region defining said isolation junction region, said isolation junction region having a tub shape comprising a bottom portion provided by said deep well region and a sidewall portion provided by said sidewall well region.

19. The method of claim 18, further comprising providing said first type of doping in said bulk semiconductor material comprising said bulk semiconductor substrate outside said isolation junction region.

20. A semiconductor structure, comprising:
a bulk semiconductor substrate comprising a bulk semiconductor material, an electrically insulating layer over said bulk semiconductor substrate and an active layer of semiconductor material over said electrically insulating layer; and
a transistor, comprising:
an active region provided in said active layer of semiconductor material, said active region comprising a source region, a channel region and a drain region;
a gate electrode region provided in a first portion of said bulk semiconductor material comprising said bulk semiconductor substrate and having a first type of doping, at least a portion of said gate electrode region being arranged directly below a portion of said electrically insulating layer below said channel region;
an isolation junction region formed in said bulk semiconductor material comprising said bulk semiconductor substrate, said isolation junction region having a second type of doping opposite said first type of doping and separating said gate electrode region from a second portion of said bulk semiconductor substrate surrounding said gate electrode region and having said first type of doping, wherein a PN-transition is formed between said gate electrode region and said isolation junction region, and wherein a PN-transition is formed between said isolation junction region and said second portion of said bulk semiconductor material comprising said bulk semiconductor substrate surrounding said gate electrode region; and an interlayer dielectric over said channel region on a side of said active layer of semiconductor material opposite said bulk semiconductor substrate.

\* \* \* \* \*